US006826223B1

(12) United States Patent
Meyer et al.

(10) Patent No.: US 6,826,223 B1
(45) Date of Patent: Nov. 30, 2004

(54) SURFACE-EMITTING PHOTONIC CRYSTAL DISTRIBUTED FEEDBACK LASER SYSTEMS AND METHODS

(75) Inventors: Jerry Meyer, Pikesville, MD (US); Igor Vurgaftman, Catonsville, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/446,259

(22) Filed: May 28, 2003

(51) Int. Cl.[7] .................................................. H01S 3/08
(52) U.S. Cl. ........................................ 372/96; 372/102
(58) Field of Search ................................... 372/92–102

(56) References Cited

U.S. PATENT DOCUMENTS

| | | | |
|---|---|---|---|
| 3,790,959 A | | 2/1974 | Eldert |
| 4,096,446 A | | 6/1978 | Haus et al. |
| 4,416,013 A | | 11/1983 | Tobin |
| 4,796,273 A | | 1/1989 | Yamaguchi |
| 5,357,591 A | * | 10/1994 | Jiang et al. ..................... 385/37 |
| 5,448,581 A | * | 9/1995 | Wu et al. ....................... 372/45 |
| 5,497,393 A | | 3/1996 | Lee |
| 5,684,817 A | * | 11/1997 | Houdre et al. ................. 372/45 |
| 6,151,347 A | * | 11/2000 | Noel et al. ..................... 372/45 |
| 6,156,255 A | | 12/2000 | Byer et al. |
| 6,366,598 B1 | * | 4/2002 | Nichols et al. ............. 372/102 |
| 6,674,778 B1 | * | 1/2004 | Lin et al. ....................... 372/46 |
| 6,704,343 B2 | * | 3/2004 | Deng et al. ................... 372/97 |
| 6,744,804 B2 | * | 6/2004 | Deng et al. ................... 372/92 |

OTHER PUBLICATIONS

Photonic–Crystal Distributed Feedback Quantum Cascade Lasers, Vurgaftman et al., IEEE Journal of Quantum Electronics, vol. 38, No. 6, Jun. 2002.

* cited by examiner

*Primary Examiner*—Wilson Lee
*Assistant Examiner*—Phillip Nguyen
(74) *Attorney, Agent, or Firm*—John J. Karasek; L. George Legg

(57) ABSTRACT

A surface-emitting photonic crystal distributed feedback laser apparatus configured to emit an optical beam of light. The apparatus includes a laser cavity bounded by top and bottom optical claddings, an active region configured to produce optical gain upon receiving optical or electrical pumping, a periodic two-dimensional grating having an order higher than the fundamental and configured to induce modulation of a modal refractive index, and lateral pumped gain area contained within an area covered by the grating, the lateral pumped gain area configured to produce gain in one or more lasing modes having a modal index modulated by the grating. The lateral pumped gain area has a substantially circular shape of diameter D, and wherein the pumped gain area is enclosed by an unpumped region contained within the area covered by the grating but not receiving the optical or electrical pumping.

41 Claims, 13 Drawing Sheets

SURFACE-EMITTING PHOTONIC CRYSTAL DISTRIBUTED FEEDBACK LASER SYSTEMS AND METHODS

FIELD OF THE INVENTION

This invention generally relates to two-dimensional distributed feedback (DFB) lasers. At least some embodiments of the invention relate to surface-emitting photonic crystal distributed feedback lasers and self-pumping self-focusing mechanisms.

BACKGROUND OF THE INVENTION

An ideal semiconductor laser that would emit high power into a single spectral mode with diffraction-limited output profile is of great interest for a number of commercial and military applications, including spectroscopy, infrared countermeasures, wavelength multiplexing in telecommunications, and diode pump arrays. However, known laser configurations have been unable to provide the desired single-mode characteristics without sacrificing power output, and vice versa. For example, the distributed-feedback (DFB) configuration with its one-dimensional (1D) diffraction grating parallel to the laser facets routinely yields high spectral purity as long as the waveguide is narrow enough with typical widths of 2–5 microns for lasers emitting at 0.8–1.55 microns wavelengths) to considerably lower the gain of higher-order lateral modes with respect to the fundamental mode and thereby prevent their excitation. However, scaling up the stripe width for increased power leads to a loss of phase coherence across the DFB laser stripe, primarily owing to the self-modulation of the refractive index in the active region by non-uniformly distributed carriers. The output then has a broadened spectral profile, ultimately limited by the width of the gain spectrum, and a rapidly diverging, often double-lobed, far-field pattern.

An ideal semiconductor laser would produce a diffraction-limited circular output beam with high optical power and a single spectral mode. In broad-area distributed-feedback lasers lateral coherence is established by defining a grating in the epitaxial device structure. In spite of the great promise of edge-emitting Photonic-crystal distributed feedback (PCDFB) lasers, drawbacks include severe ellipticity of the output beam having a fast angular divergence along the growth axis and a slow divergence along the laser stripe. In prior SE PCDFB lasers, the use of electrical pumping obscured identification of the lasing model(s). The impact of PCDFB grating structure choice on device performance, and the relation to one-dimensional SE DFB lasers was not understood. The absence of a general theoretical description of SE PCDFB lasers precluded any systematic analyses of the limits to their single-mode operation, output power, and brightness.

The basic concept of employing 2D DFB gratings was proposed by Wang and Sheem (U.S. Pat. No. 3,970,959). However, there was no guidance provided concerning the proper choice of the device parameters or the 2D lattice structure.

Other prior approaches considered only two superimposed 1D gratings (rather than actual 2D gratings), in which only two diffraction processes are possible. Furthermore, realistic device geometries were not considered, and the critical role played by the linewidth enhancement factor (LEF) was not considered.

SUMMARY OF THE INVENTION

At least some embodiments of the invention relate to surface-emitting photonic crystal distributed feedback lasers and self-pumping self-focusing mechanisms.

According to one embodiment, a surface-emitting photonic crystal distributed feedback laser apparatus configured to output an optical beam of light is described. The apparatus includes a laser waveguide bounded by a top and bottom optical claddings, an active region configured to produce optical gain upon receiving optical or electrical pumping to inject electrons and holes into the active gain region, a periodic two-dimensional grating having an order higher than the fundamental, the grating configured to induce modulation of a modal refractive index and a lateral pumped gain area contained within an area covered by the grating and configured to produce gain in one or more lasing modes and the modal index of the one or more lasing modes is modulated by the periodic two-dimensional grating, the lateral pumped gain area having a substantially circular shape of diameter D, and wherein the pumped gain area is enclosed by an unpumped region contained within the area covered by the grating but not receiving the optical or electrical pumping.

According to another embodiment of the invention, a method of producing a diffraction-limited beam using a surface emitting photonic crystal distributed feedback laser. The method comprises providing a waveguide in a laser cavity bounded by top and bottom optical claddings; configuring an active region to produce optical gain upon receiving optical or electrical pumping; providing a periodic two-dimensional grating having an order higher than a fundamental, the grating configured to modulate a modal refractive index; confining a lateral pumped gain area to within an area covered by the grating, the gain area configured to produce gain in at least one lasing mode having a modal index modulated by the periodic two-dimensional grating, the lateral pumped gain area having a substantially circular shape of diameter D; and enclosing the gain area by an unpumped region contained within the area covered by the grating but not receiving the optical or electrical pumping.

According to an additional embodiment of the invention, a method of producing a diffraction-limited beam using a surface emitting photonic crystal DFB laser, comprising a) selecting one or more parameters for a two-dimensional grating to operate at a predetermined wavelength; b) calculating coupling coefficients $\kappa_1$, $\kappa_2$, and $\kappa_3$ using at least the grating parameters; c) calculating output power and beam quality of the laser; d) determining if the output power corresponds to a desired quantum efficiency; and e) determining if the beam quality is in a desired range relative to the diffraction limit.

Other aspects of the invention are disclosed herein as is apparent following description and figures.

DESCRIPTION OF THE DRAWINGS

Preferred embodiments of the invention are described below with reference to the following accompanying drawings.

DETAILED DESCRIPTION OF THE INVENTION

This disclosure of the invention is submitted in furtherance of the constitutional purposes of the U.S. Patent Laws "to promote the progress of science and useful arts" (Article 1, Section 8).

In one embodiment, the SE PCDFB uses a time-domain Fourier-Galerkin (TDFG) numerical solution of a reduced wave equation. A parameter space having high differential quantum efficiency is used in combination with single-mode operation and a near-diffraction limited output beam. A two-dimensional square lattice or hexagonal-lattice grating without any phase shifts and only refractive index modulation is found to be sufficient to produce a symmetric mode that is coherent over a wide device area.

Figure 1A:
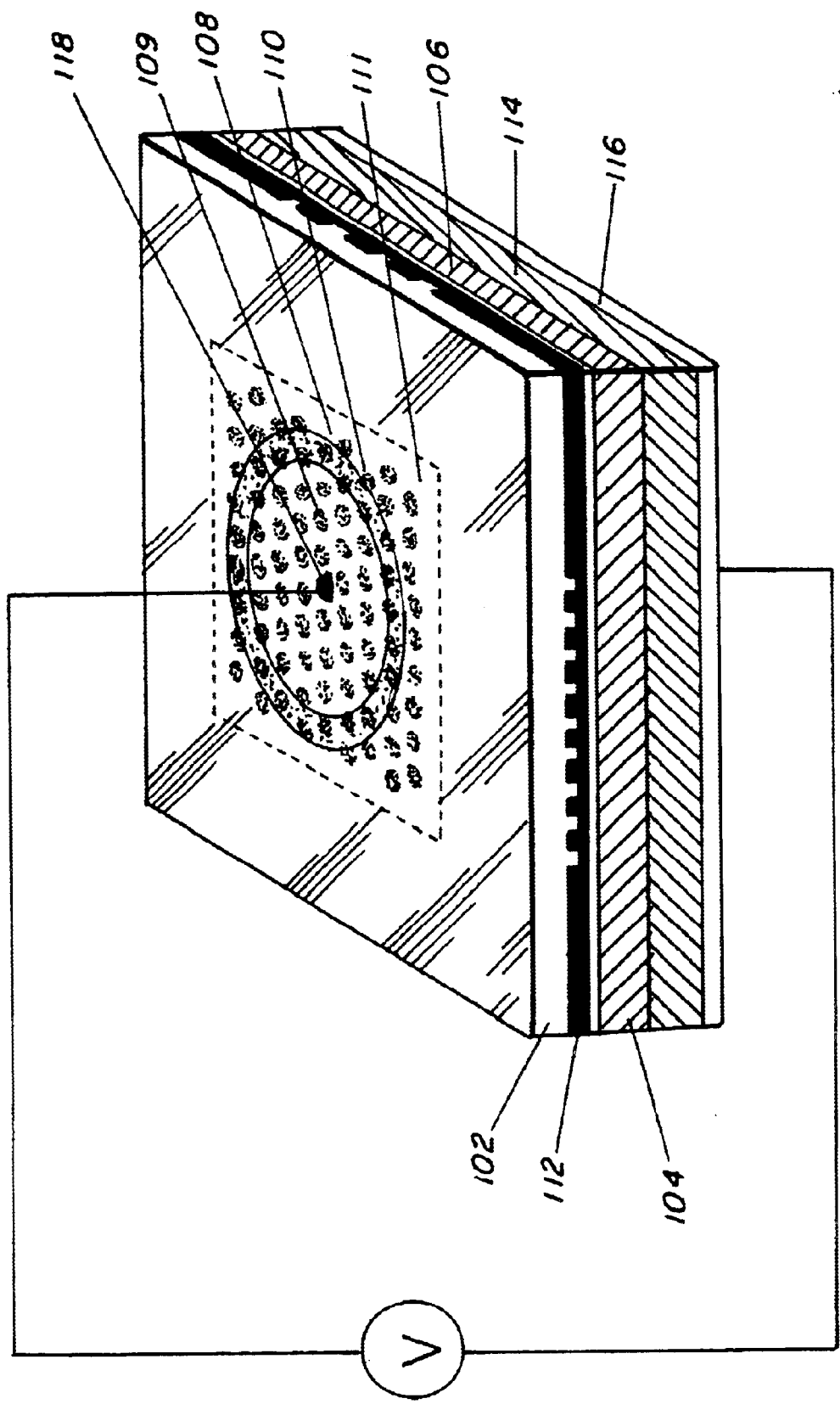
FIG. 1a is a schematic of the 2D photonic crystal distributed feedback (PCDFB) laser in accordance with one embodiment of the present invention.

Referring to FIG. 1a, there is shown a cross-sectional schematic 100 of the surface-emitting photonic crystal distributed feedback (SE PCDFB) laser in accordance with one embodiment of the present invention. Laser 100 includes a laser waveguide comprised of an active region 106 configured to produce optical gain upon receiving optical or electrical pumping, the active region 106 having a lateral pumped gain area 109. The laser 100 also includes a top and bottom optical claddings 102, 104, respectively, and a periodic two-dimensional grating 110 having an order higher than the fundamental, the grating 110 configured to induce modulation of a modal refractive index. In the example embodiment shown in FIG. 1a, the grating 110 which extends over an area 111 is formed in a layer 112 in the waveguide. Other arrangements of forming gratings in multiple layers of materials are also possible. The lateral pumped gain area 109, contained within the grating area 111, is pumped either optically or electrically to produce gain in one or more lasing modes whose modal index is modulated by the grating 110. It will be appreciated that the lateral pumped gain area 109 is the lateral extent of a gain region whose vertical extent is the active region 106.

Electrodes 116, 118 are provided for connecting the laser 100 to a voltage source. In an exemplary embodiment, the electrode 116 is an optically opaque electrode configured to apply an input voltage to the laser apparatus, the opaque electrode covering a portion of the lateral pumped gain area, and the electrode 118 is transparent. In one embodiment, the lateral pumped gain area 109 has a nearly circular shape of diameter D, and wherein the gain area 109 is enclosed by an unpumped region 108 contained within the grating area 111, the unpumped region 108 configured so as to not receive the optical or electrical pumping. In one embodiment, etch features of the grating 110 are substantially circular with a diameter of about 60–70% of the period of the hexagonal lattice.

Figure 1B:
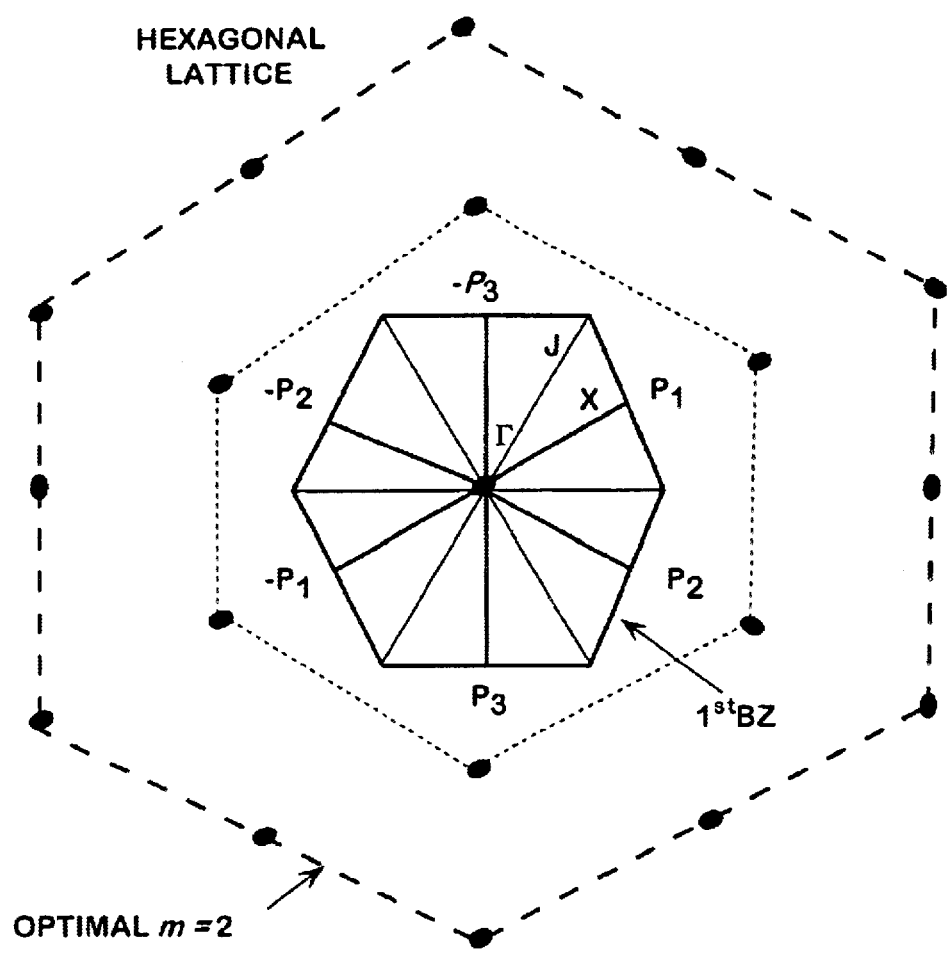
FIG. 1b is a reciprocal-space diagram showing the Brillouin-zone boundaries for the Γ-point of a hexagonal lattice of the 2D grating. Diffraction by this crystal structure produces surface emission by the photonic crystal distributed feedback (PCDFB) laser in accordance with one embodiment of the present invention.

FIG. 1b is a reciprocal-space diagram of the hexagonal lattice of the 2D grating which produces surface emission in accordance with one embodiment of the present invention. The primary symmetry points $\Gamma$, X, and J are illustrated in the figure along with the boundary of the first Brillouin zone shown as a thin line. Since diffraction processes taking place at this zone boundary do not produce any surface emission, one of the higher zone boundaries must be employed for this purpose. Both m=1 and m=2 zone boundaries (in the notation defined below) are shown in the figure. It will be demonstrated that the greatest flexibility and the optimized designs are obtained using diffraction at m=2.

Time-domain Fourier-Galerkin Formalism

In the TDFG, Bloch expansion of the field and dielectric-constant components are substituted into a wave equation for a TM polarized electric field. The modifications for TE-polarized light are addressed as below:

$$\sum_{G'} \hat{\kappa}(G-G')\left[|k+G'|^2 a_{k+G'} - i(2k+G+G')\cdot\vec{\nabla} a_{k+G'} - \nabla^2 a_{k+G'}\right] = \quad (1)$$

$$\left[\frac{\omega_0^2}{c^2} n_0^2 - i\frac{\omega_0}{c} n_0 \hat{G} + i\frac{2\omega_0}{c^2} n_0^2 \frac{\partial}{\partial t}\right] a_{k+G}$$

where $a_k(r,t)$ are optical field components with wave vector k, $\kappa(G)$ represents the diffractive coupling corresponding to a reciprocal lattice vector G, $n_0$ is the average value of the modal refractive index $n_m(r)$, and $\omega_0 = k_0 n_0/c$ is the center frequency. The carrier contribution may be written out explicitly as: $\hat{G} = \Gamma_c g(1-;\alpha) - \alpha_i$, where $\Gamma_c$ is the active-region optical confinement factor, g(r,N) is the material gain, N is the carrier density calculated from the appropriate rate equation, $\alpha = -4\pi/\lambda (dn_m/dN)/(dg/dN)$ is the linewidth enhancement factor (LEF), which measures the focusing/defocusing induced by carrier-density perturbations, and $\alpha$ is the internal loss. The product of the threshold gain and the LEF ($\Gamma_c g_{th} \alpha$) is a figure of merit that governs the optical coherence properties of high-power single-mode lasers. In edge-emitting semiconductor lasers, a low value of that product is nearly always desired.

Retention of the explicit time dependence in Eq. (1) allows modeling of the spectral properties. In one embodiment, the time derivatives can be treated without approximation (apart from the discretization of the spatial and time intervals). For a particular PC lattice symmetry, Eq. (1) can be simplified considerably by limiting the expansion to a small number of reciprocal lattice vectors G.

Figure 1C:
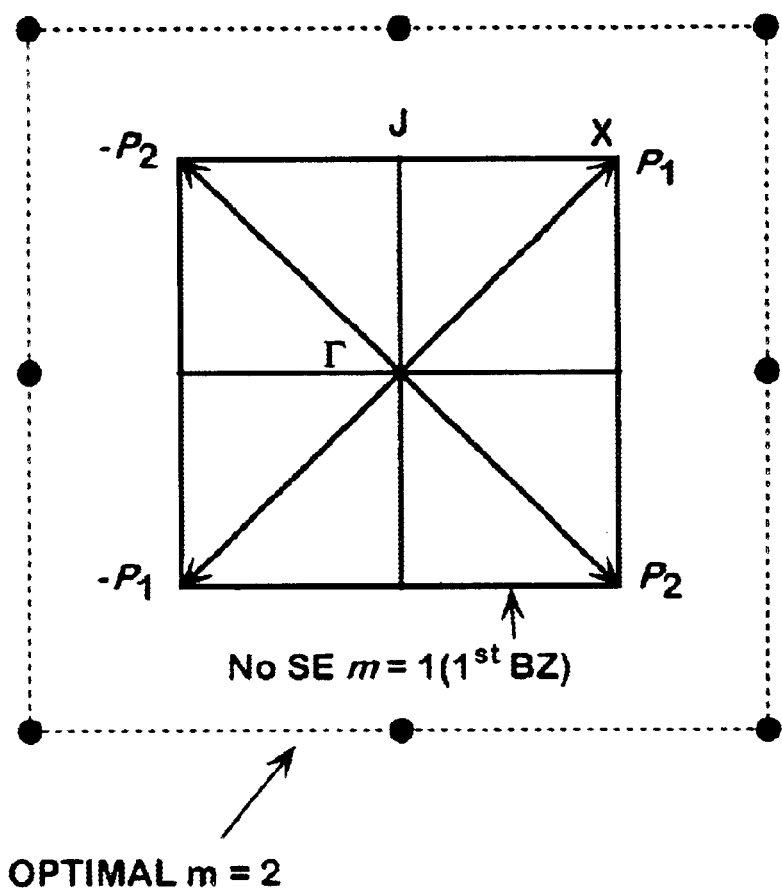
FIG. 1(c) is a reciprocal-space diagram showing the Brillouin-zone boundaries for the Γ-point of a square lattice of the 2D grating.

For example, consider a square lattice with period $\Lambda$ as shown in FIG. 1c, the four equivalent propagation directions are labeled $P_1$, $P_2$, $-P_1$, and $-P_2$. Two sets of high-symmetry propagation angles are possible: (1) with $P_1$ oriented along the diagonal of the primitive unit cell; and (2) with $P_1$ bisecting the side of the primitive unit cell. Since at a given wavelength the period is larger by a factor of $\sqrt{2}$ for the first choice ($P_1=\{1,1\}$, $P_2=\{-1,1\}$, $-P_1=\{-1,-1\}$, and $-P_2=\{1,-1\}$, where the $\{l,m\}$ represents components along the two axes in units of $2\pi/\Lambda$), it is adopted in one embodiment of the invention. However, the inventive concepts are equally applicable to lasers employing a second choice of orientation. The square lattice provides nonzero coupling into an orthogonal in-plane propagation direction only for TM-polarized light. For notational simplicity, the coordinate system is rotated such that the z-axis points along the diagonal of the unit cell $\{1,1\}$. Also consider $k_0 n_0 = m\pi\sqrt{2}/\Lambda$, i.e., $\Lambda = m\lambda_c/(\sqrt{2} n_0)$, where $\lambda_c$ is the grating's resonance wavelength.

In an embodiment with a square lattice, the grating is defined on the square lattice with four equivalent propagation directions spaced at 90° angles, and the grating is configured to produce three distinct in-plane diffraction processes from one of said equivalent propagation directions into another one of the equivalent propagation directions, the first of said diffraction processes being reflection by an angle of 180° and having a coupling coefficient $\kappa_1$, and the second and third of said diffraction processes being diffraction by an angle of 90° and having a coupling coefficient of $\kappa_2$, and an out-of-plane diffraction process from one of said equivalent propagation directions into a direction perpendicular to all four of said directions and having a coupling coefficient $\kappa_0$.

It would be difficult to start from a scalar wave equation and then treat the surface-emitting terms on the same footing as the in-plane coupling terms. Scalar equations are generally written for the field component polarized in a direction that is not considered further, whereas all three spatial dimensions are to be considered in the present invention. Rather than attempt a full vectorial rederivation from Maxwell's equations, the inventors introduce the surface-emitting terms as a perturbation, along with the terms that reduce to the previously treated 1D form. This approximation should be valid as long as the grating is sufficiently "weak", which applies to the simulations that follow in the sense that both $\Delta n/n_0$ and the dielectric contrast at the grating interface are small. On the other hand, the weak-grating assumption may break down in such cases as a metallized grating with a large coefficient coupling the guided modes to the field radiating normal to the waveguide.

The inventors have observed that strong coupling to the surface emission is not a necessary condition for obtaining high-efficiency coherent emission from a large device area. In fact, it was found to be undesirable for the surface-emitting coefficient to be either substantially larger or substantially smaller than the internal loss.

The in-plane coupling coefficients, $\kappa_1$ and $\kappa_2$, are introduced by following the discussion disclosed in the publication "Photonic-Crystal Distributed-Feedback quantum Cascade Lasers", IEEE J. Quantum Electronics, June 2002, the entire disclosure of which is incorporated by references. It is well known that in addition to the in-plane diffraction, Bragg reflections with m>1 also produce losses associated with emission out of the plane. That emission, into a layer with $n_1<n_0$, occurs at an angle $\phi$ with respect to normal whenever $\sin\phi = n_0(P_1-G)/n_1 P_1 < 1$ for any G. Focusing on the m=2 case, the surface-emitting terms can be added as a perturbation of the equations to treat edge-emitting PCDFB lasers. For "weak" gratings, the Green's function solution of the ridge-waveguide problem leads to the introduction of a surface out-coupling coefficient, $\kappa_0$, defined more precisely as below.

In one exemplary embodiment, it may not be necessary to include more than four components, since the net power in the higher-order components is expected to be lower by two orders of magnitude. For example, it is assumed that all of the field components should couple to the radiating wave at the same rate, provided that the etched features do not have a lower symmetry than the lattice (e.g., when the features are circular). Thus all four components experience an out-coupling loss proportional to the product of $\kappa_0$ and the radiating-field magnitude, which is given by the coherent sum of the field components.

The resulting final form of the propagation equations for a square lattice with TM polarization is:

$$\frac{\partial a_1}{\partial t} = \frac{c}{n_0}\left[-\frac{\partial a_1}{\partial z} + \frac{\Gamma g(1-i\alpha) - \alpha_i - 2\kappa_0}{2} a_1 + \right. \quad (2)$$

$$\left. \frac{i}{2 k_0 n_0}\nabla^2 a_1 + (-i\kappa_1 - \kappa_0)\bar{a}_1 + (-i\kappa_2 - \kappa_0)(a_2 + \bar{a}_2)\right]$$

$$\frac{\partial a_2}{\partial t} = \frac{c}{n_0}\left[-\frac{\partial a_2}{\partial x} + \frac{\Gamma g(1-i\alpha) - \alpha_i - 2\kappa_0}{2} a_2 + \right. \quad (3)$$

$$\left. \frac{i}{2 k_0 n_0}\nabla^2 a_2 + (-i\kappa_1 - \kappa_0)\bar{a}_2 + (-i\kappa_2 - \kappa_0)(a_1 + \bar{a}_1)\right]$$

Similar equations hold for $\bar{a}_1$ and $\bar{a}_2$, except for a reversal of the sign in front of the first derivative and removing the bars from the field components in the first coupling term. Note the close analogy of Eqs. (2) and (3) to the field equations derived previously for 1D DFB structures in a co-pending application having application Ser. No. 10/385,165 and filed on Mar. 7, 2003, the entire contents of which are incorporated herein by reference, with the important difference (aside from the doubling of dimensions and components) being retention of the second-order derivatives throughout our formalism. Since the $\kappa_2$ coefficient vanishes for TE polarization, the square lattice was found to be not a viable choice for large-area coherent emission in that polarization.

Examining the coupling coefficients, $\kappa_0$, $\kappa_1$, and $\kappa_2$, more closely it is observed that for the m=2 coupling order, the wavevector and reciprocal lattice vectors are defined: k={0, 0}, $G_1$={1,1}, $G_{-1}$={-1,-1}, $G_2$={-1,1}, and $G_{-2}$={1,-1}. For a relatively small index modulation ($\Delta n$), the following expressions for the in-plane coupling coefficients $\kappa_1$ and $\kappa_2$ are obtained:

$$\kappa_1 = \frac{2\pi \Delta n}{\lambda} \frac{1}{a_L} \int\int_R dxdz \, \exp[-i(G_1 - G_{-1}) \cdot r] \quad (4)$$

$$\kappa_2 = \frac{2\pi \Delta n}{\lambda} \frac{1}{a_L} \int\int_R dxdz \, \exp[-i(G_1 - G_2) \cdot r] \quad (5)$$

where i=1, 2, $a_L$ is the area of the reciprocal-lattice primitive cell, $|G_1-G_{-1}|=|G_2-G_{-2}|$, and $|G_1-G_2|=|G_{-1}-G_{-2}|=|G_1-G_{-2}|=|=G_{-1}-G_2|$. Considering index-modulation regions R that are symmetric with respect to reflection along the propagation axes, the imaginary parts of Eqs. (4) and (5) vanish. For example, for simplicity, the present discussion is confined to features R (e.g., circles, squares oriented along one of the axes etc.) that have identical arguments in the exponent of Eqs. (4) and (5) for all the equivalent couplings, although a certain amount of asymmetry can be tolerated in practice and is included in the scope of the present invention.

With these assumptions, the coefficient $\kappa_1$ accounts for the reflection-like diffraction into the counter-propagating wave, e.g., from $P_1$ into $-P_1$ or from $P_2$ into $-P_2$. The coefficient $\kappa_2$ represents diffraction into the perpendicular in-plane component, e.g., from $P_1$ into $P_2$ or $-P_2$, or from $P_2$ into $P_1$ or $-P_1$. The corresponding expression for the surface-coupling coefficient, $\kappa_0$, which quantifies diffraction from all four waves $P_1$, $-P_1$, $P_2$, and $-P_2$ into the radiating wave, is given by $$\kappa_0 = \frac{d_R}{\Gamma_R} \left| \frac{2\pi \Delta n}{\lambda} \frac{1}{a_L} \int\int_R dxdz \, \exp(-iG_1 \cdot r) \right|^2 \quad (6)$$

where $d_g$ is the thickness of the grating layer and $\Gamma_g$ is its confinement factor. For m=2, $G_1-G_{-1}=2G_1$, and in the weak-modulation limit $\kappa_1$ and $\kappa_2$ are proportional to $\Delta n$ whereas $\kappa_0 \propto \Delta n^2$. Equations (4)–(6) are generalized to the case of complex coupling by setting the imaginary part $\text{Im}\{\Delta n\}=-(\lambda/4\pi)\Delta g$ or $(\lambda/4\pi)\Delta \alpha_d$.

Since the gain is in principle a spatio-temporal function that depends on the complex field components via the carrier rate equation, Eqs. (2) and (3) are in fact second-order nonlinear differential equations in 3 dimensions. In the following a split-step Fourier-Galerkin solution of these equations is described, subject to Dirichlet boundary conditions in the two spatial dimensions based on approximate linearization for short time intervals $\Delta t$. In order to perform the linearization, in Eqs. (2) and (3) the gain term is separated from the diffraction-coupling terms, transforming the latter into the frequency domain using fast Fourier transformations (FFT). Without the gain term, Eqs. (2) and (3) then read:

$$\frac{\partial \tilde{a}_1}{\partial t} = \frac{c}{n_0}\left[-i\frac{2\pi l_z}{L_z \Delta z}\tilde{a}_1 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_1 + \right. \quad (7)$$

$$\left. (-i\kappa_1 - \kappa_0)\tilde{a}_1 + (-i\kappa_2 - \kappa_0)(\tilde{a}_2 + \tilde{\bar{a}}_2)\right]$$

$$\frac{\partial \tilde{a}_2}{\partial t} = \frac{c}{n_0}\left[-i\frac{2\pi l_x}{L_x \Delta x}\tilde{a}_2 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_2 + \right. \quad (8)$$

$$\left. (-i\kappa_1 - \kappa_0)\tilde{a}_2 + (-i\kappa_2 - \kappa_0)(\tilde{a}_1 + \tilde{\bar{a}}_1)\right]$$

where the components with tildes have been obtained using the discrete Fourier transform of the original variables on a mesh ($\Delta x, \Delta z$) in the laser plane. Since the lattice is square, consider $\Delta x=\Delta z$. In Eqs. (7) and (8), the indices corresponding to the spatial frequencies are labeled $I_x$ and $I_z$ ($0 \leq I_x \leq L_x-1$, $0 \leq I_z \leq L_z-1$). Thus for each time step, Eqs. (7) and 8) can be solved using the fourth-order Runge-Kutta method applicable to ordinary differential equations of the first order. Numerical simulations by the inventors confirm that the Fourier-Galerkin method described above offers a much higher precision than other possible approaches. For example, the finite-difference approximation was found to be unsuitable owing to a substantial phase error.

The second part of the split-step TDFG algorithm involves evaluation of the optical-gain and refractive-index-fluctuation terms from the rate equation for the carrier density and the appropriate gain vs. density model. The field components are back-transformed to real space and integrated at each spatial mesh point, for example, using the Runge-Kutta method. The procedure may be repeated until turn-on transients are eliminated. The output spectra are obtained from the power spectrum of the surface-emitting field. The etendue determined from the 2D near-field and far-field profiles is defined as the geometric average of the figures of merit measured along the two orthogonal in-plane directions.

In one embodiment, the figure of merit identified herein is in most cases equivalent to the $M^2$ figure of merit and is proportional to the product of the standard deviation of the near-field profile and the average angle of the far-field profile. The standard deviation is not employed for the far-field profile in order to minimize the experimental measurement error at large angles. The result for the geometric average of the figures of merit is then normalized to the etendue of a circular Gaussian beam with diffraction-limited beam quality. In most cases, the symmetry of the device structure leads to a symmetric output beam.

The TDFG algorithm of the present invention does not include spontaneous emission. Generally the spontaneous emission magnitude can only be roughly estimated, and the inventors have found that it has negligible influence on the operation far above threshold. While the primary role of spontaneous emission is to provide seeding for the initial laser turn-on dynamics, simulations by the inventors confirm that any initial distribution (obtained with a pseudorandom number generator) leads to the same steady-state solutions described below.

The power emitted from the surface is calculated from the expression:

$$P = \frac{c}{n_0}\kappa_0 \int\int dxdz |a_1 + \bar{a}_1 + a_2 + \bar{a}_2|^2 \qquad (9)$$

where the coherent sum of the field components is proportional to the amplitude of the surface-emitting field. An important difference exists between the intensity of the waveguide-confined laser light, which is proportional to the sum of the squares of the individual field components because carrier diffusion washes out effects on the scale of $\lambda_c/n_0$, and the intensity of the light emitted normal to the laser plane, which is proportional to the square of the sum of these components.

A similar TDFG algorithm as described above is applicable to the hexagonal lattice with period $\Lambda$. For example, consider the six-fold coupling that takes place at the $\Gamma$ point with propagation vectors pointing along the $\Gamma$-X directions. Defining $\beta=(4\sqrt{3}/3)m\pi/\Lambda[\Lambda=(2\sqrt{3}/3)m\lambda_c/n_0$, m=1, 2, 3, ... ], the relevant reciprocal lattice vectors become: $G_1=\beta(0,1)$, $G_{-1}=\beta(0,-1)$, $G_2=\beta(\sqrt{3}/2, \frac{1}{2})$, $G_{-2}=\beta(-\sqrt{3}/2,-\frac{1}{2})$, $G_3=\beta(-\sqrt{3}/2,\frac{1}{2})$, and $G_{-3}=\beta(\sqrt{3}/2,-\frac{1}{2})$. There are now six equivalent propagation directions [$P_1=(0,1)$; $P_2=(\sqrt{3}/2,\frac{1}{2})$; and $P_3=(-\sqrt{3}/2, \frac{1}{2})$]. In one embodiment, for circular features (and other shapes that preserve the distance from the origin to the intersection of the reciprocal-lattice vectors with the Brillouin-zone boundary), three distinct coupling coefficients can be calculated. The inventors use a convention whereby $\kappa_1$ is the DFB-like coefficient corresponding to distributed reflection by 180° (e.g., from $P_1$ to $P_{-1}$), $\kappa_2$ is the coefficient for diffraction by a 60° angle (e.g., $P_1$ to $P_2$, $P_1$ to $P_3$, or $P_{-2}$ to $P_3$) and $\kappa_3$ is the coefficient for diffraction by 120° (e.g., $P_1$ to $P_{-2}$, $P_1$ to $P_{-3}$, or $P_2$ to $P_{-1}$). The coupling coefficients $\kappa_1$ and $\kappa_2$ are computed using Eqs. (4) and (5), and the coupling coefficient $\kappa_3$ from:

$$\kappa_3 = \frac{2\pi\Delta n}{\lambda}\frac{1}{a_L}\int\int_R dxdz \exp[-i(G_i - G_{-2})\cdot r] \qquad (10)$$

The surface-emitting coefficient $\kappa_0$ is again calculated from Eq. (6). Evaluations of the coupling coefficients corresponding to circular features can be found in the above incorporated reference. In place of Eqs. (7) and (8), the following formulas are employed:

$$\frac{\partial \tilde{a}_1}{\partial t} = \frac{c}{n_0}\left[-i\frac{2\pi l_z}{L_z \Delta z}\tilde{a}_1 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_1 + \right.$$
$$\left. (-i\kappa_1 - \kappa_0)\tilde{a}_1 + (-i\kappa_2 - \kappa_0)(\tilde{a}_2 + \tilde{a}_3) + (-i\kappa_3 - \kappa_0)(\bar{\tilde{a}}_2 + \tilde{a}_3)\right] \qquad (11)$$

$$\frac{\partial \tilde{a}_2}{\partial t} = $$
$$\frac{c}{n_0}\left[-i\frac{\pi l_z}{L_z \Delta z}\tilde{a}_2 - i\frac{\sqrt{3}\pi l_x}{L_x \Delta x}\tilde{a}_2 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_1 + \right.$$
$$\left. (-i\kappa_1 - \kappa_0)\tilde{a}_2 + (-i\kappa_2 - \kappa_0)(\tilde{a}_1 + \tilde{a}_3) + (-i\kappa_3 - \kappa_0)(\bar{\tilde{a}}_3 + \tilde{a}_1)\right] \qquad (12)$$

$$\frac{\partial \tilde{a}_3}{\partial t} = $$
$$\frac{c}{n_0}\left[-i\frac{\pi l_z}{L_z \Delta z}\tilde{a}_3 + i\frac{\sqrt{3}\pi l_x}{L_x \Delta x}\tilde{a}_3 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_1 + \right.$$
$$\left. (-i\kappa_1 - \kappa_0)\tilde{a}_3 + (-i\kappa_2 - \kappa_0)(\tilde{a}_1 + \tilde{a}_2) + (-i\kappa_3 - \kappa_0)(\tilde{a}_2 + \bar{\tilde{a}}_1)\right] \qquad (13)$$

For example, the hexagonal lattice can also be used to obtain surface emission with TE-polarized light. In that case, the following substitutions should be made in Eqs. (11)–(13): $\kappa_1 \rightarrow -\kappa_1$, $\kappa_2 \rightarrow \kappa_2/2$, and $\kappa_3 \rightarrow -\kappa_3/2$. In the following, the values of $\kappa_2$ and $\kappa_3$ for TE polarization are divided by a factor of 2 as compared to the definitions in Eqs. (5) and (10). The sign change in two of the three coupling coefficients leads to different optimized designs for TE- and TM-polarized surface-emitting PCDFB lasers.

In one embodiment of the SE PCDFB laser using the disclosed self-pumping/self-focusing (SPSF) mechanism, the pumped area 109 (which may be pumped either optically or electrically) is circular and has a top-hat injection profile, although similar results are obtained for a Gaussian profile, and small deviations from circularity are not of significance. In the exemplary embodiment shown in FIG. 1a, the pumped spot 109 (FIG. 1a) is taken to be far away from any facets and/or discontinuities in the grating 110 (FIG. 1a). The properties of the active-region 106 are assumed to be uniform over the entire simulation area, although this is not required by the TDFG formalism. In an exemplary case, for definiteness, the optical or electrical pump injection level is assumed to be 10 times the threshold value.

In a preferred embodiment, the gain spectrum is considered to be much broader than any spectral features associated with the grating 110 (FIG. 1a) and the peak of the gain spectrum is aligned with the cavity resonance wavelength. The inventors have observed that the lattice temperature increase does not substantially detune the gain peak from the cavity resonance for pulsed-mode operation.

Since the SE PCDFB relies on diffraction from higher grating orders, the index modulation $\Delta n$ is preferred to be rather large, e.g., several percent of the modal refractive index. In the preferred embodiment, the grating 110 (FIG. 1a) is realized by etching holes into the grating layer 112 and epitaxially regrowing a lower-index cladding material 102 (FIG. 1a) In other embodiments, a metallic grating may be deposited, a dielectric material with index lower than that of the waveguide core is deposited, or the holes are left empty. In the case where a metallic grating is deposited, the inventors have observed that modulations of the imaginary part of the refractive index generally dominate and there is a large dielectric contrast across the interface.

For the regrowth approach, the dielectric deposition approach, or the approach in which the holes are left empty, the modulation of $\Delta n$ is primarily real, with only a small imaginary contribution arising from variations of the optical confinement factor in the active region. For example, in the following sample calculations the modulation is taken to be purely real, although the results were found to be unchanged when the simulation includes an imaginary component of the expected magnitude.

Since for most interband semiconductor lasers the optical gain is greater for TE polarization than for TM, in the sample calculations a hexagonal lattice was used. In one embodiment, for definiteness, the inventors have used a parameter set characteristic of the mid-IR "W" active region with 40 periods emitting at $\lambda_c=4.6$ $\mu$m. However, the results would be the same for any active region with the same differential gain of $10^{-15}$ cm$^2$ and optical confinement factor per period of ≈1%. Assuming that the mid-IR test structure includes a GaSb grating layer on top of the active region, we obtain $d_g/\Gamma_g$=1.5 μm. Since $\kappa_0$ scales quadratically with Δn whereas the other coupling coefficients scale linearly (at relatively small Δn), the results observed by the inventors are expected to hold at least qualitatively when $d_g/\Gamma_g$ varies somewhat.

The TDFG simulations show that a single-mode SE PCDFB laser can display at least three distinct near-field patterns. Although two of those correspond to undesirable far-field profiles, the third (preferred) mode may be selected by following a set of design rules that will be presented below.

Figure 2A:
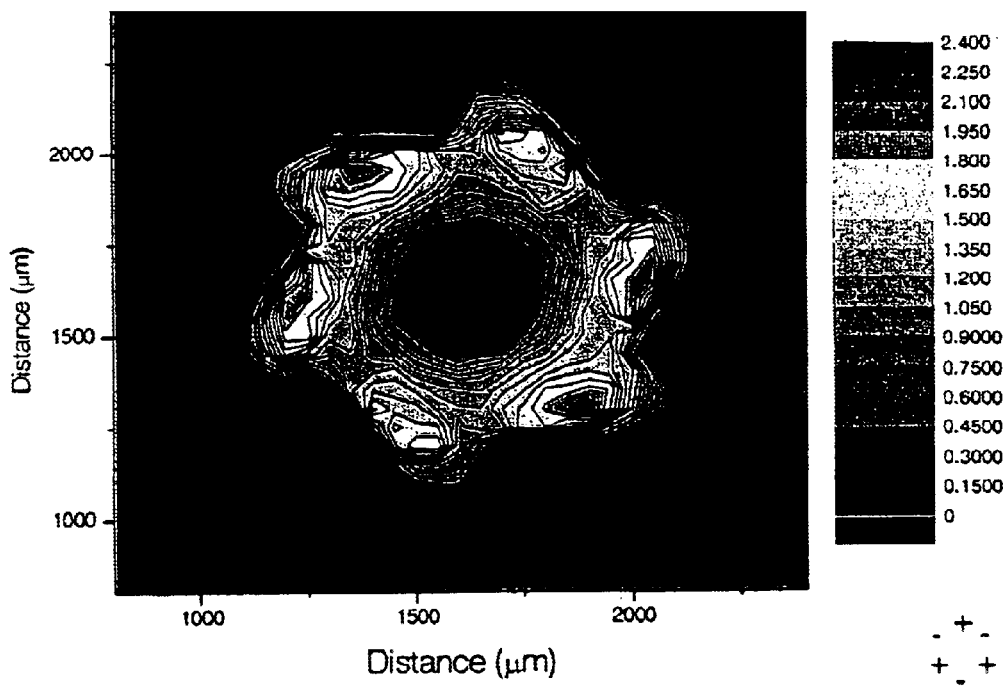
FIGS. 2a–2b show near-field profiles for the 6-lobed and 2-lobed out of phase modes of a hexagonal-lattice SE PCDFB with TE polarization.

FIG. 2(a) illustrates that the near-field characteristic for one of the three modes form an annular pattern, with six peaks spaced almost evenly around the perimeter of the annulus. The diagrams in the lower right-hand corner illustrate schematically the signs of the six field components displaced from the origin in their propagation directions. For this mode, the phases of the six field components alternate as a function of azimuthal angle, so that no two adjacent components separated by 60° experience constructive interference.

Figure 2B:
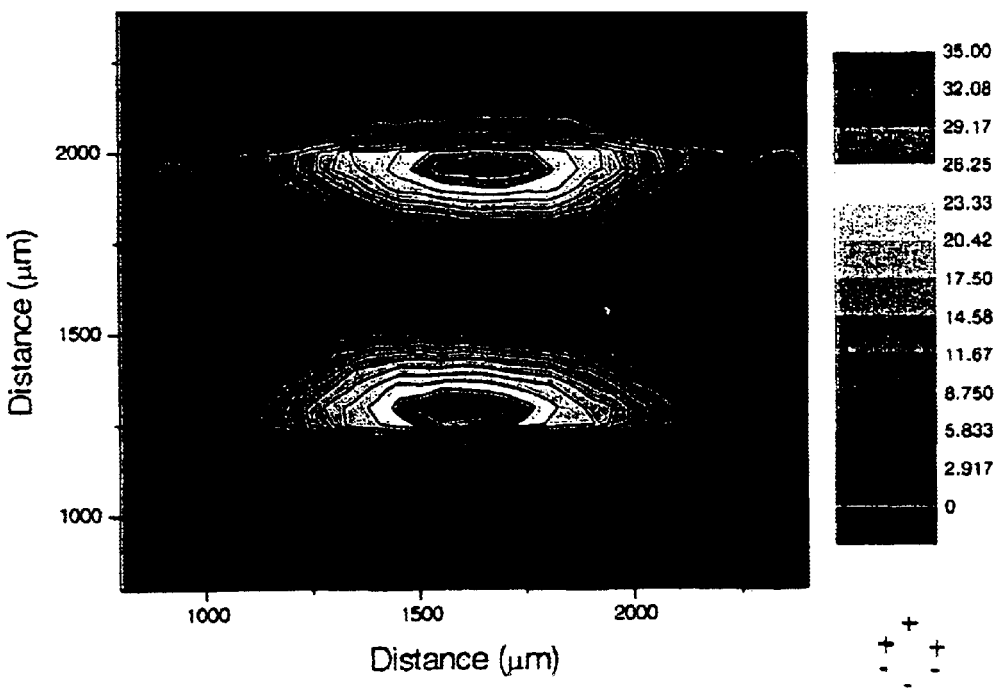

For the second mode structure illustrated in FIG. 2(b), the phase is flipped as one crosses a given axis. This produces a near-field structure that has only two lobes. Both of the modes shown in FIGS. 2(a) and 2(b) may be classified as out-of-phase, since pronounced destructive interference in the surface-emitted component substantially reduces the output power and also degrades the beam quality. The simulations show that a small amount of gain coupling (on the order of 10% of the index modulation) leads to stabilization of the six-lobe pattern FIG. 2(a) in those cases where the two-lobe pattern FIG. 2(b) would otherwise dominate.

In one embodiment, the PC DFB laser is configured to maximize the output power of the optical beam from the laser so that a differential quantum efficiency is no smaller than about 3%, and the laser is further configured to optimize the beam quality of the optical beam so that it is no worse than about three times the diffraction limit.

Figure 2C:
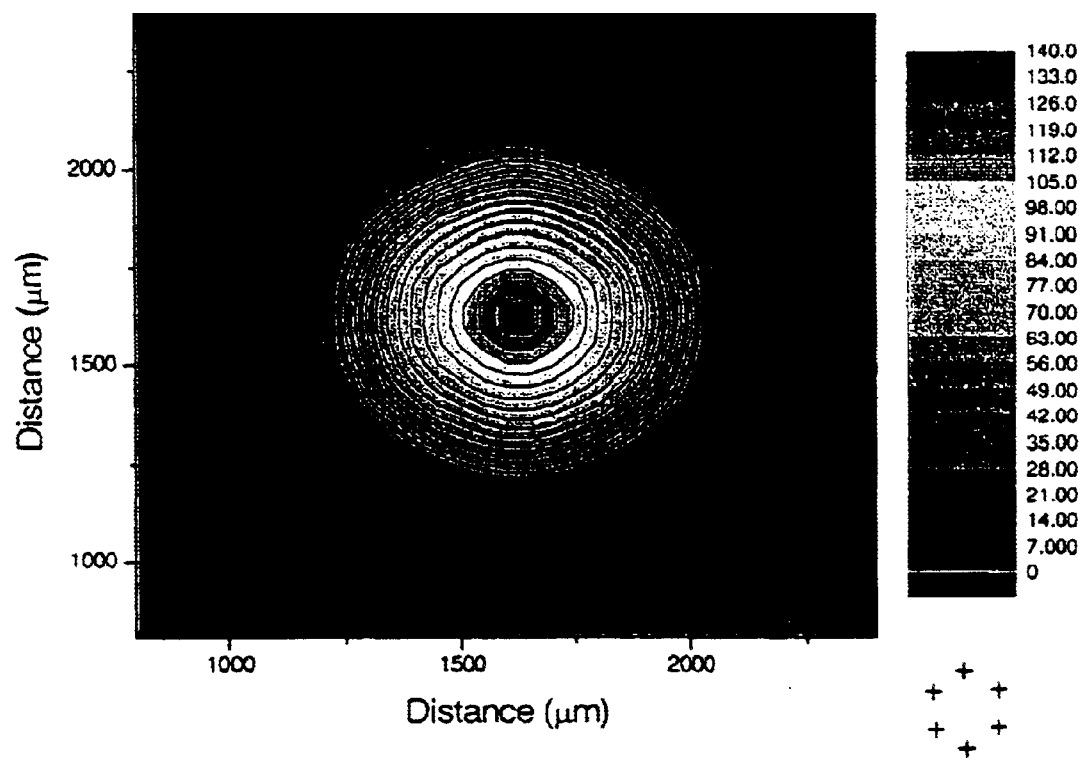
FIG. 2c shows a single-lobed in-phase mode of a hexagonal-lattice surface emitting (SE) PCDFB with TE polarization. The diagrams in the lower right-hand corner illustrate schematically the signs of the six field components displaced from the origin in their propagation directions.

A third mode, which can have the lowest threshold gain under certain conditions, is symmetric and single-lobed because all six components have the same phase. FIG. 2(c) shows that the symmetric near-field pattern for this in-phase mode is close to a circular Gaussian profile.

Figure 3:
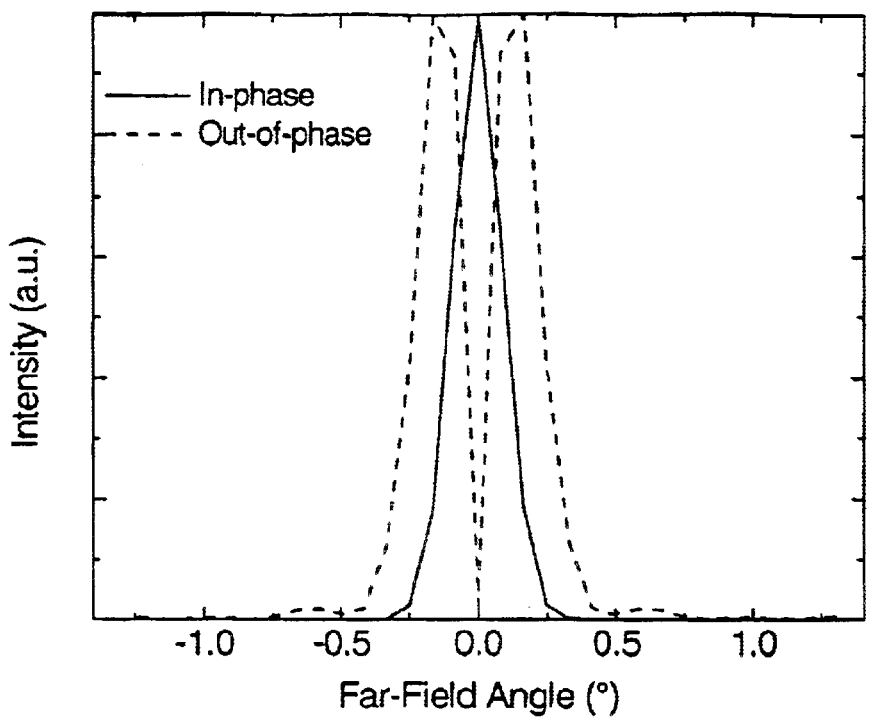
FIG. 3 shows far-field profiles along one of the axes for the modes depicted in FIG. 2b (dashed curve) and FIG. 2c (solid curve).

FIG. 3 shows that the corresponding far-field pattern (solid curve) is also single-lobed, and quite narrow. On the other hand, the second out-of-phase mode is double-lobed in the far-field (dashed curve of FIG. 3) as it was in the near-field (FIG. 2b), along the same phase-flip axis. The net angular divergence is clearly much smaller for the in-phase mode, resulting in a beam quality that is typically no more than 20–30% greater than the diffraction limit (DL) when the near-field and far-field characteristics are combined.

In one embodiment, the present invention relates to means of stabilizing the in-phase mode in FIG. 2(c) over the out-of-phase modes in FIG. 2(a) and FIG. 2(b) by means of reducing its threshold gain relative to all the other modes. From simulations that explored a broad range of the available design space, the inventors have determined that operation in the symmetric (in-phase) single mode can be reliably selected as long as the following exemplary criteria are met (except as noted, the conditions for TM polarization are similar):

(1) The mode must preferably be allowed to self-pump regions somewhat beyond the nominal pump spot (the self-pumping requirement).

(2) The linewidth enhancement factor and the internal loss are preferred to be sufficiently large, with the two minimum values being interdependent. This self-focusing condition will be expressed more precisely below.

(3) For TE polarization, the signs of the in-plane coupling coefficients are preferred to be: $\kappa_1$>0, $\kappa_2$<0, and $\kappa_3$>0, although single-mode operation with somewhat degraded characteristics may also be obtained with: $\kappa_1$<0, $\kappa_2$>0, and $\kappa_3$<0. For TM polarization this condition becomes: $\kappa_1$<0, $\kappa_2$<0, and $\kappa_3$<0.

(4) The magnitudes of at least two of the coupling coefficients (taken to be $\kappa_2$ and $\kappa_3$) should range approximately from 1/D to 3/D, while the third coefficient (taken to be $\kappa_1$) falls between 1/(5D) and 3/D, where D is the diameter of the pump spot.

(5) $\kappa_0$ is preferred not to be much larger than 1 cm$^{-1}$, with the exact upper limit depending on the LEF, internal loss, and pump spot diameter as described above.

Having identified the preferred design space that assures emission into a single-lobed symmetric mode, its implementation in practice for the case of a hexagonal PCDFB lattice is shown. Assuming that Condition (1) as described above is met, first consider Conditions (3)–(5). By calculating the coupling coefficients for circular etched features, optimized lattice structures for both TE and TM polarizations are deduced. One finding is that neither polarization can reach optimized performance in the lowest diffraction order m=1 [the order definitions precede Eqs. (11–13)]. However, with m=2 the larger reciprocal lattice vectors afford sufficient freedom for simultaneously optimizing all four coupling coefficients.

Figure 4:
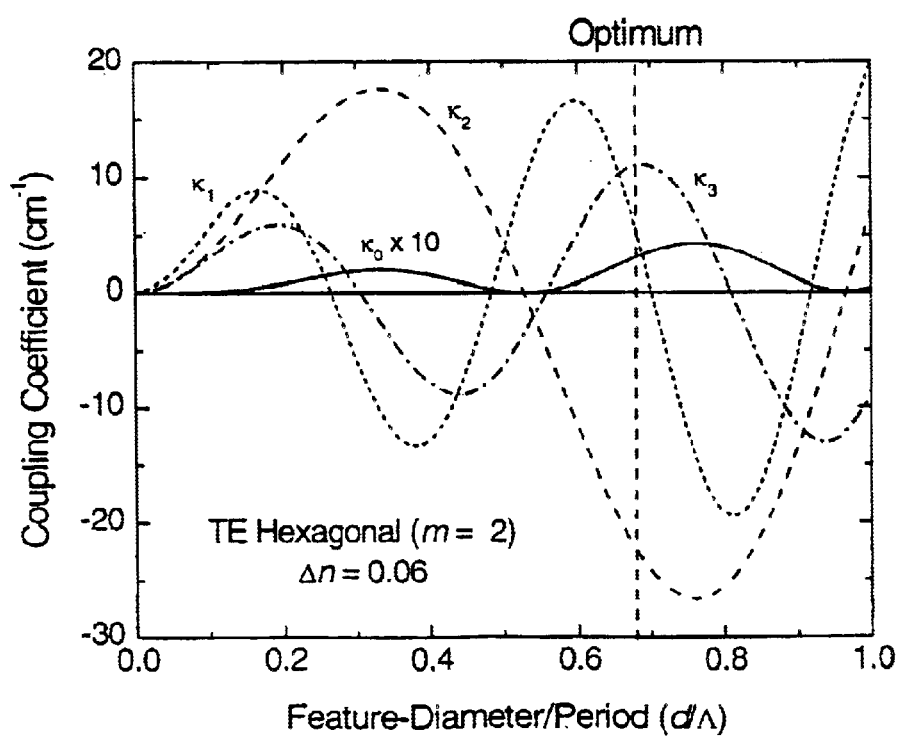
FIG. 4 is a graph showing coupling coefficients $\kappa_1$ (dotted), $\kappa_2$ (dashed), $\kappa_3$ (dash-dot), and $\kappa_0$ (solid) as a function of circular feature, diameter for a hexagonal-lattice (m=2) SE PCDFB with TE polarization. The modulation of the modal index is $\Delta n=0.06$.

For TE polarization and an index modulation of Δn=0.06, FIG. 4 plots the four $\kappa_i$ variations as a function of feature-diameter/period ratio (d/Λ). The inventors have found in an exemplary case, that Conditions (3)–(5) are satisfied for feature diameters falling in the range 0.6Λ<d<0.7Λ, with d≈0.68Λ being optimal. This assumes a pump-spot diameter (D) on the order of 1 mm. However, the same d/λ ratio tends to satisfy Conditions (3)–(5) for other D as well, if Δn is varied to scale the coupling coefficients. This confirms that there is a limited, but straightforwardly accessible parameter space that may be expected to yield high-efficiency SE PCDFB emission into a single in-phase mode. On the other hand, for TM polarization the optimum diameter is d≈0.90Λ, which is considerably more demanding from the fabrication standpoint. Therefore in that case a square lattice is employed in the preferred embodiment.

Quantifying Condition (2), which follows from the observation made below that LEF=0 inevitably leads to SE PCDFB operation in an out-of-phase mode. The need for a minimum LEF starkly contrasts the requirements of conventional PCDFB and other edge-emitting semiconductor lasers, since those devices nearly always perform best when the product of the LEF and the threshold modal gain is as small as possible, further details of which are described in the article by I. Vurgaftman and J. R. Meyer, "Photonic-Crystal Distributed-Feedback Quantum Cascade Lasers", IEEE J. Quantum Electronics 38, 592 (2002)], the entire contents of which are incorporated herein by reference. To some extent, one can compensate for a small LEF (e.g., <1) in the SE PCDFB by increasing the internal loss (α). However, that strategy naturally reduces the quantum efficiency and output power.

Figure 5:
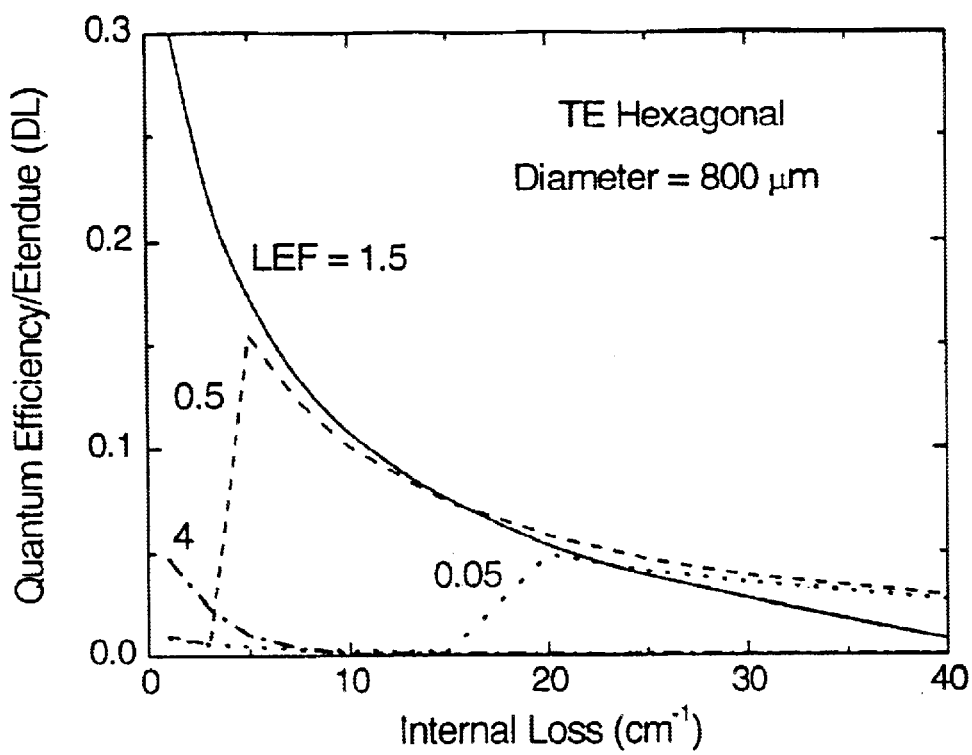
FIG. 5 is a graph showing external differential quantum efficiency divided by the etendue (i.e., normalized brightness) as a function of internal loss for hexagonal-lattice TE-polarized SE PCDFBs with circular feature diameter $d=0.684\Lambda$ and index modulation $\Delta n=0.06$. Results are given for LEF=0.05 (dotted), LEF=0.5 (dashed), LEF=1.5 (solid), and LEF=4 (dash-dot).

In an exemplary illustration, FIG. 5 plots the "normalized brightness", defined as the external differential quantum efficiency (assuming an internal efficiency of unity) divided by the etendue (in units of the DL), as a function of internal loss for several representative values of the LEF. The simulations, for example, assume a hexagonal lattice (d=0.684Λ, $\kappa_1$=6.1 cm$^{-1}$, $\kappa_2$=cm$^{-1}$, $\kappa_3$=15 cm$^{-1}$, $\kappa_0$=0.31 cm$^{-1}$, with a pump spot diameter of D=800 μm. When LEF=0.05 (characteristic of optimized quantum dot lasers), in-phase emission occurs only when α≧20 cm$^{-1}$, which imposes a limit of≈5% on the normalized brightness. As the LEF is increased to 0.5 (characteristic of non-uniform quantum dot lasers and optimized near-IR strained quantum-well QW) diodes), in-phase operation is possible down to α≈5 cm$^{-1}$, which boosts the maximum normalized brightness to ≈15%. For any LEF≦0.5, the SE PCDFB emits in a single mode for all considered values of the internal loss (≦40 cm$^{-1}$) despite the large diameter of the pump spot.

Optimal performance is expected when LEF≈1–2 which is characteristic of many interband QW diode lasers operating in the visible, near-IR (1–2 μm) and mid-IR wavelength ranges. The inventors estimate that a maximum normalized brightness of at least 30%, which may be improved by up to an additional factor of 2 if the equal emission in the opposite direction can be collected. This indicates that performance on a par with optimized edge-emitting PCDFB lasers should be possible, with the added advantage of a symmetric circular output beam. However, the LEF=1.5 curve decreases rapidly above α>20 cm–1, since at that point the output becomes multi-mode. Thus the SE PCDFB approach becomes disadvantageous for QW diodes with high losses. The inventors have found that the normalized brightness never reaches an attractive value when the LEF>2, since the operation remains multi-mode. This is shown in FIG. 5 for LEF=4.

Figure 6:
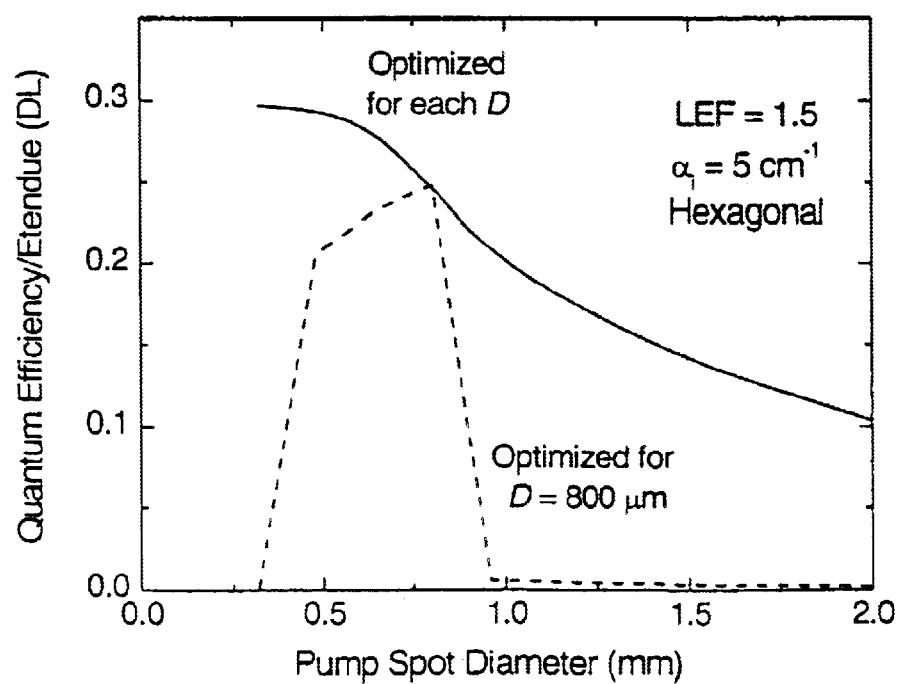
FIG. 6 is a graph showing normalized brightness as a function of pump-spot diameter D for hexagonal-lattice TE-polarized SE PCDFBs with circular feature diameters $d=0.684\Lambda$, LEF=1.5, and an internal loss of 5 cm$^{-1}$. The solid curve represents re-optimization of the index modulation for each pump-spot diameter, whereas the dashed curve holds the modulation fixed at $\Delta n=0.06$ (optimized for D=800 $\mu$m).

FIG. 6 shows a graph of the normalized brightness as a function of pump-spot diameter, where the solid curve corresponds to re-optimization of the etch depth at each D. The consequences of increasing D to maximize the single-mode output power are next described. Since the discrimination between in-phase and out-of-phase modes, resulting from the imposition of additional losses by self-pumping, is greatest for a small pump-spot area, the preferred index modulation decreases as D increases. The inventors have found that the optimal value ranges from Δn=0.12 for D=300 μm to Δn=0.039 for D=2 mm. Although the maximum single-mode output power is greatest for the largest pump spot, the efficiency decreases considerably at large D. In the opposite limit of D<<300 μm, the index modulation required to make an attractive device becomes so large that it probably cannot be realized without a fundamental modification of the waveguide geometry.

Whereas each point of the solid curve in FIG. 6 corresponds to a different etch depth, it is also of interest to examine the range of pump-spot diameters over which a single SE PCDFB device with fixed Δn may be operated. The dashed curve in FIG. 6 plots the normalized brightness for the etch depth that maximizes the single-mode power at D=800 μm (Δn=0.06). We find that such a device should operate in a single in-phase mode when 500 μm<D<900 μm, although that range can be extended at the expense of slightly lower peak efficiency if the etch depth is reduced somewhat. Single-mode in-phase operation is maintained for an index modulation as little as Δn≈0.04.

An advantage of the SE PCDFB lasers using the SPSF mechanism is the ability to produce a high-efficiency, near-diffraction-limited, circular, spectrally pure output beam in a direction normal to the device plane from a very broad emitting aperture (a diameter on the order of 1 mm). Since vertical-cavity surface-emitting lasers (VCSELs) can produce such a beam only from a narrow aperture (a diameter on the order of a few wavelengths) and edge-emitting PCDFB lasers cannot produce a circular output beam, the above capability is unique in the semiconductor-laser field.

Only the definition of the 2D grating is necessary for device fabrication. Unlike the edge-emitting 1D DFB and PCDFB lasers, no facets are required and no alignment of the grating (e.g., to a cleave plane) is needed. Since the SE PCDFB laser generally operates in a relatively high diffraction order, the critical dimension in the lithographical definition of the grating is not excessively small. For example, for the emission wavelength of 1.55 μm the required period of the hexagonal-lattice (m=2) grating is approximately 1.0 μm, and the separation between the features in the preferred embodiment ranges from 300 to 400 nm. For comparison, the commonly used edge-emitting 1D DFB devices emitting at the same wavelength require a period of approximately 220 nm and a feature size of 110 nm.

The realization of the self-pumping mechanism is straightforward in both 2D and 1D. The only requirement is not to limit the active region to the pump spot, i.e. the region optically or electrically pumped above threshold should preferably be surrounded by unpumped material with the same gain characteristics. For example, in 1D the self-pumping requirement is realized by placing any reflective interfaces (such as mirror facets) far away (at distances on the order of several hundred microns) away from the region pumped above threshold. In 2D the self-pumping can be accomplished by pumping sufficiently far away from any discontinuities in the material such as the edges of the wafer.

Most prior simulations of 1D SE DFB lasers have failed to account for the LEF, which according to modeling carried by the inventors can lead to the erroneous conclusion that the antisymmetric mode always has lower threshold gain. In one study that included the LEF, the potential for lasing in the symmetric mode was not observed because too high a value was employed for the surface-emitting coupling coefficient ($\kappa_0$).

Figure 10:
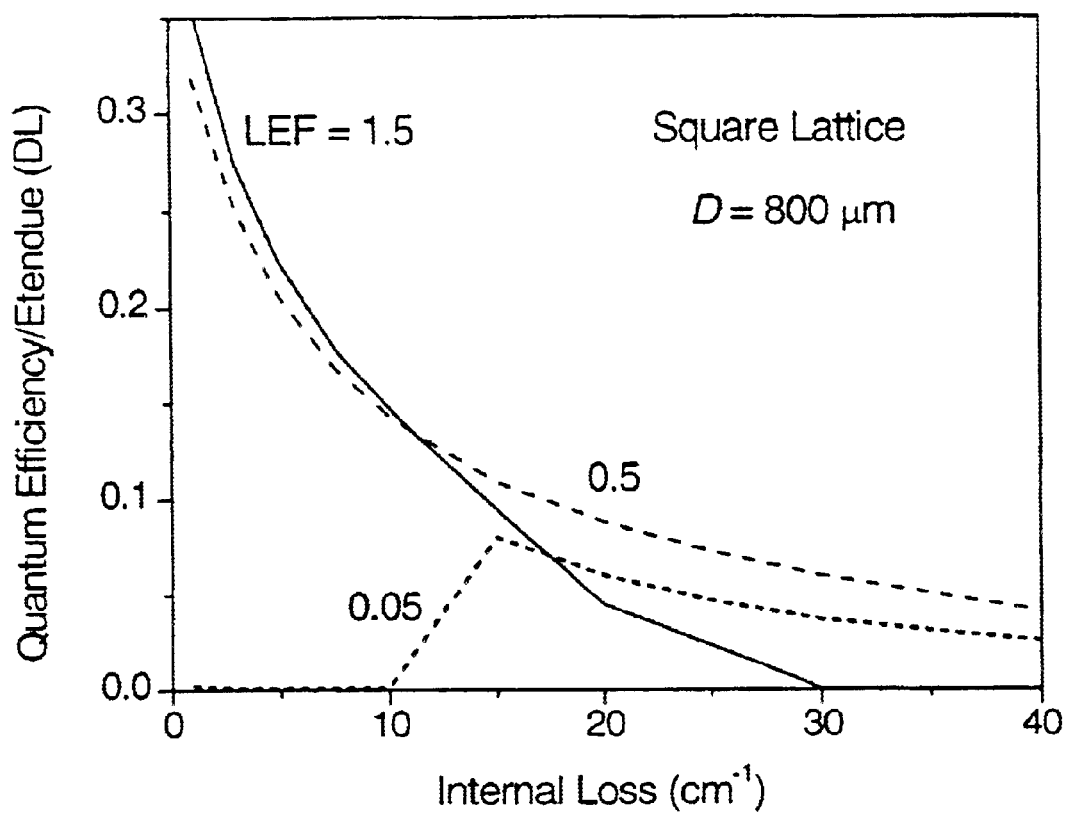
FIG. 10 is a graph showing normalized brightness as a function of internal loss for square-lattice TM-polarized SE PCDFBs with circular features of diameter $d=0.70\Lambda$ and index modulation $\Delta n=0.043$. Results are given for LEF=0.05 (dotted curve), LEF=0.5 (dashed), and LEF=1.5 (solid).

For most of the known 1D SE DFB devices, a relatively high $\kappa_0$ (of order 10 cm$^{-1}$) was employed since the output power emitted from the surface nominally scales with this coupling [see FIG. 10)]. However, a large $\kappa_0$ makes it difficult to select the symmetric mode, since secondary effects cannot overcome such a wide gain margin. The inventors have recognized that by reducing $\kappa_0$ to <1 cm$^-$, one can manipulate the relative modal losses such that the in-phase mode actually has a lower threshold gain than the out-of-phase mode.

In particular, this can be accomplished with self-pumping and self-focusing (governed by the LEF and the internal loss), because the out-of-phase mode extends farther into the unpumped regions and consequently experiences higher loss. That effect is enhanced by weaker self-focusing of the anti-symmetric mode which is more extended spatially. The inventors in their TDFG simulations have observed that stronger constructive interference of the in-phase mode more than compensates for the reduced out-coupling coefficient. Conditions (3) and (4) above are necessary to maintain coherence over a large-area emitting aperture.

For example, an approximate upper bound on the normalized efficiency may be written as $6\kappa_0/(\alpha+2\kappa_0+\alpha_d)$, where $\alpha_d$ is the self-consistent diffraction loss from self-pumping and the prefactor of 6 corresponds to independent contributions by the 6 constructively-interfering field components (the prefactor is 12 for coupling into both output directions). The upper bound can never exceed one, since by analogy with 1D SE DFB lasers the in-phase operation is obtained only when $\alpha_d \geq 12\kappa_0$. The prefactor is reduced to 4 for a square lattice, because then there are only four rather than six field components. This expression for the upper bound shows that a seemingly low value of $\kappa_0$ may nevertheless result in high-efficiency operation.

Figure 7:
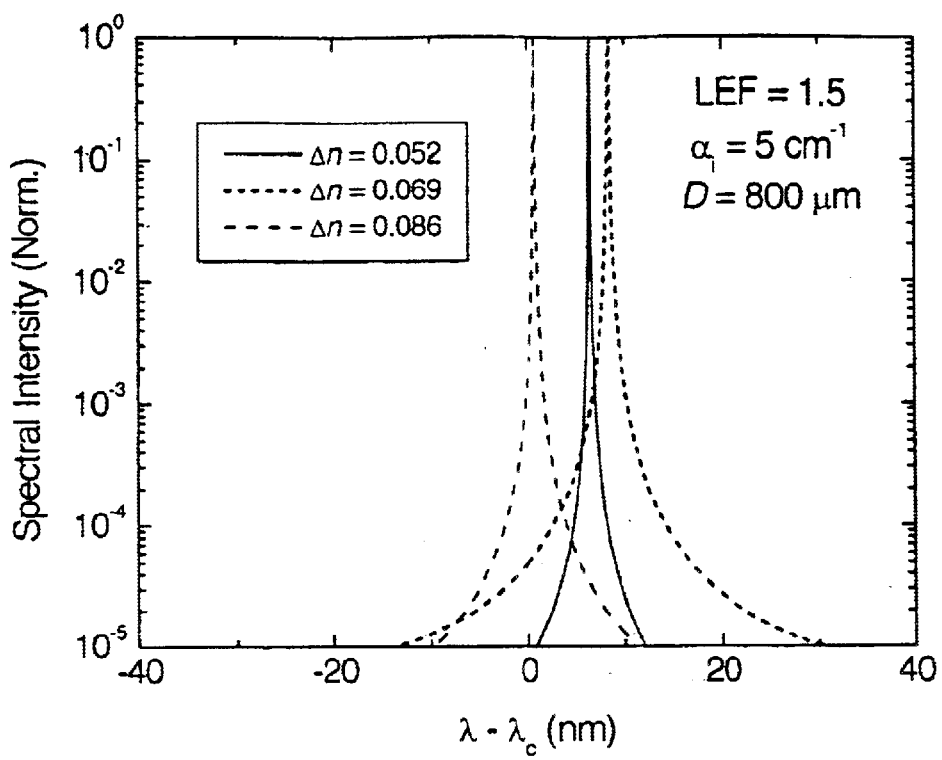
FIG. 7 is a graph showing spectral characteristics of hexagonal-lattice TE-polarized SE PCDFBs with fixed LEF (1.5), internal loss (5 cm$^{-1}$), and pump-spot diameter (800 $\mu$m). Spectra are shown for $\Delta n=0.052$ (solid), 0.069 (dotted), and 0.086 (dashed), where in each case the peak intensity is normalized to unity rather than to the total power.

The advantages of SE PCDFB lasers employing the SPSF mechanism are reflected in the spectral characteristics of these devices as described below. FIG. 7 shows projected spectral characteristics for typical interband QW devices (LEF=1.5, $\alpha$=5 cm$^{-1}$) with D=800 $\mu$m at several different $\Delta$n. In-phase operation is seen to occur on the long-wavelength side of the resonance wavelength $\lambda_c$. The difference between the lasing frequency and $\lambda_c$ is approximately proportional to $\Delta$n, although if the index modulation becomes too large there is a transition to an out-of-phase mode with wavelength slightly longer than $\lambda_c$. One may also conclude from FIG. 7 that it should not place any excessive demands on current processing technologies to stay within tolerance for the rather non-critical range of acceptable etch depths.

Figure 8:
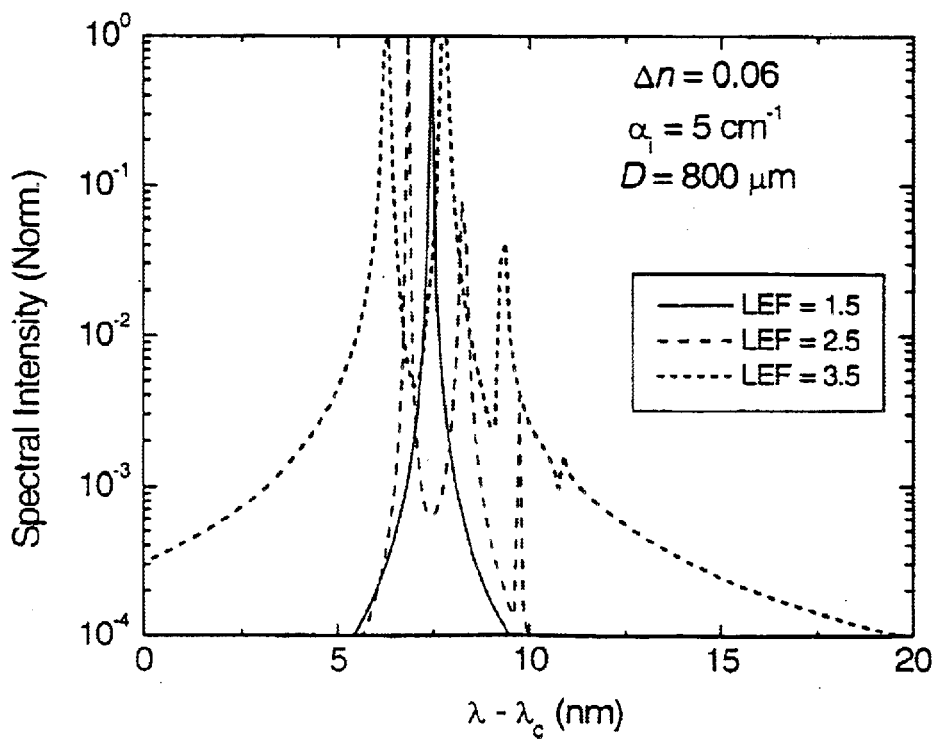
FIG. 8 is a graph showing spectra for hexagonal-lattice TE-polarized SE PCDFBs with fixed internal loss (5 cm$^{-1}$), pump-spot diameter (800 $\mu$m), and index modulation (0.06), at a series of LEF: 1.5 (solid), 2.5 (dashed), and 3.5 (dotted). The peak intensities are normalized to unity.

FIG. 8 illustrates another limit on the spectral purity, imposed by degradation of the mode structure when the LEF is increased. Note that at LEF=2.5 the SMSR drops to 12 dB, while for LEF$\geq$3.5 one cannot avoid having at least two competing modes with similar amplitudes.

The general features of the SPSF mechanism as applied to the SE PCDFB are also applicable to many classes of semiconductor-laser active regions emitting at wavelengths from the visible to the far-IR. Of these active regions, the preferred embodiments will be those with the LEF ranging from 0.5 to 2 and a low internal loss (<20 cm$^{-1}$), although the possibility of employing active regions that do not satisfy these requirements is not excluded. In one embodiment, the linewidth enhancement factor is increased to about 1 by varying electronic densities of states.

One preferred embodiment of the SE PCDFB laser using the disclosed self-pumping/self-focusing (SPSF) mechanism is optically pumped, since current injection may under some conditions introduce compromises associated with partial blocking of the emitting aperture by electrical contacts. Nevertheless, electrically pumped devices represent one of the alternative embodiments, since they can employ the same SPSF mechanism to operate in an in-phase, circular mode. The optimization of electrically pumped SE PCDFB lasers will depend on the degree to which current spreading can be used as a means for maximizing the emission area outside of the contacts (which can be either monolithic, annular, or a mesh grid). The optimization of electrically pumped SE PCDFB lasers will thus be specific to a given material system. A preferred embodiment with electrical pumping would employ transparent contacts, e.g., based on the deposition of indium tin oxide (ITO). In the limit of a completely transparent top contact that coincides with the lateral pumped gain area 109 and does not contribute to the lateral modulation of the refractive index by the grating, the electrical pumping case becomes completely analogous to optical pumping and the design optimization may be performed in the same manner.

Although embodiments of the present invention focus on gratings fabricated by regrowth, metallic gratings defined by depositing a metal such as gold into etched holes is also possible. The SPSF mechanism is also applicable to buried gratings with primarily imaginary modulation of the refraction index (gain coupling) or to the general case of complex coupling.

Considering the polarization of the output beam, since the output beam emerges nearly normal to the device plane, its polarization may vary in a random manner within that plane depending on small, uncontrollable errors occurring during the fabrication process. However, for some applications it may be useful to induce the output beam to have a fixed specified polarization. In an alternative embodiment, the polarization direction may be fixed by weakly perturbing the etched features to make them asymmetric (e.g., elliptical instead of circular).

The output power has thus far been taken to be only half of the light emitted normal to the laser plane, since the other half emitted in the opposite direction is generally not collected. However, blazed gratings or extra reflectors may be used boost the output power by up to a factor of 2. For example, a distributed Bragg reflector 114 (FIG. 1a) grown below the active region 106 (FIG. 1a) can increase the efficiency of an epitaxial-side-up mounted device. For epitaxial-side-down mounting, the same can be accomplished by adjusting the thickness of the regrown material to an integer number of half-wavelengths in that material and then coating the surface adjacent to the heat sink with a high-reflectivity metal. Other means known to the art may also be used to reflect the beam emitted in one vertical direction such that it is added to the beam emitted in the opposite direction. In all cases, the optical path length must be adjusted so as to assure that the reflected beam constructively interferes with beam emitted in the opposite vertical direction. In one embodiment, a reflector 114 may be disposed at an opposite vertical end with respect to an output beam emitted by the laser apparatus 100 such that reflection of light from the reflector 114 constructively interferes with the output beam.

The hexagonal lattice geometry is the preferred embodiment for the TE-polarization case that is the basis for most interband QW lasers. The square lattice cannot maintain lateral coherence for the TE-polarization, since $\kappa_2$=0 due to symmetry. The reduced symmetry of a rectangular lattice leads to non-zero $\kappa_2$, which can also be employed in conjunction with the SPSF mechanism, although the results are not expected to be as good as for the hexagonal lattice.

The square lattice is the preferred alternative embodiment for lasers whose gain is stronger for TM polarization. This is true for intersubband lasers such as the QCL and also certain heavily-strained QW lasers with a light-hole-like valence band maximum. These devices can also operate using the hexagonal and rectangular lattices. The TDFG simulations show that Conditions (1)–(5) as described above needed to attain in-phase rather than out-of-phase operation are applicable to the square lattice with TM polarization as well [for which $\kappa_2$=$\kappa_3$ in Conditions (3) and (4)] except as noted in those Conditions.

Figure 9A:
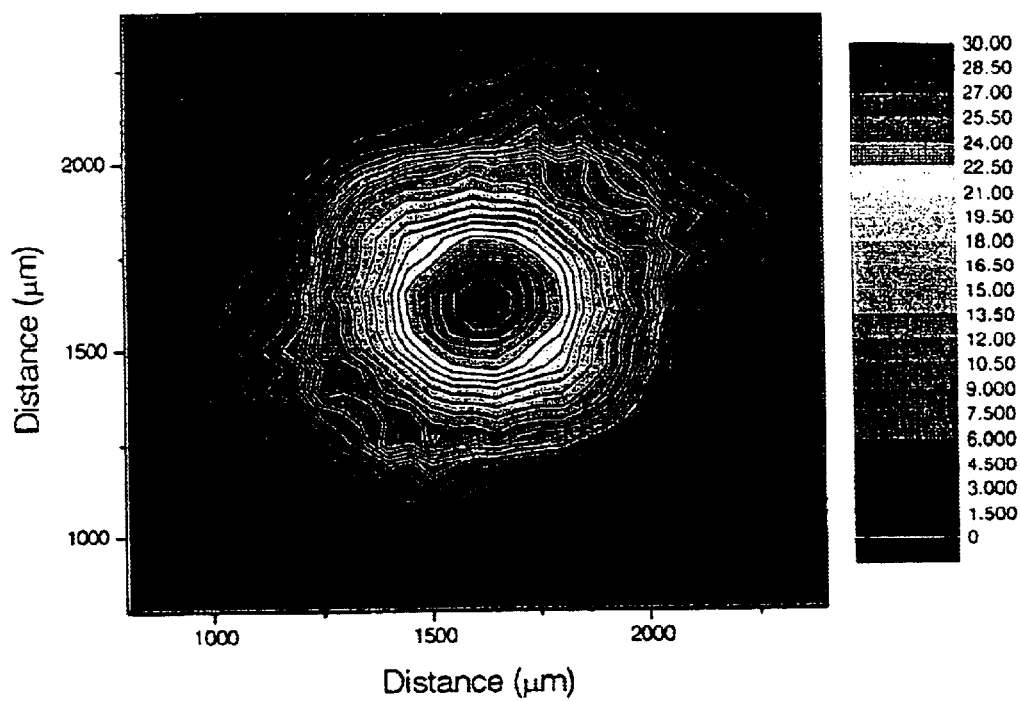
FIG. 9a shows the near-field profile for a typical in-phase mode.
Figure 9B:
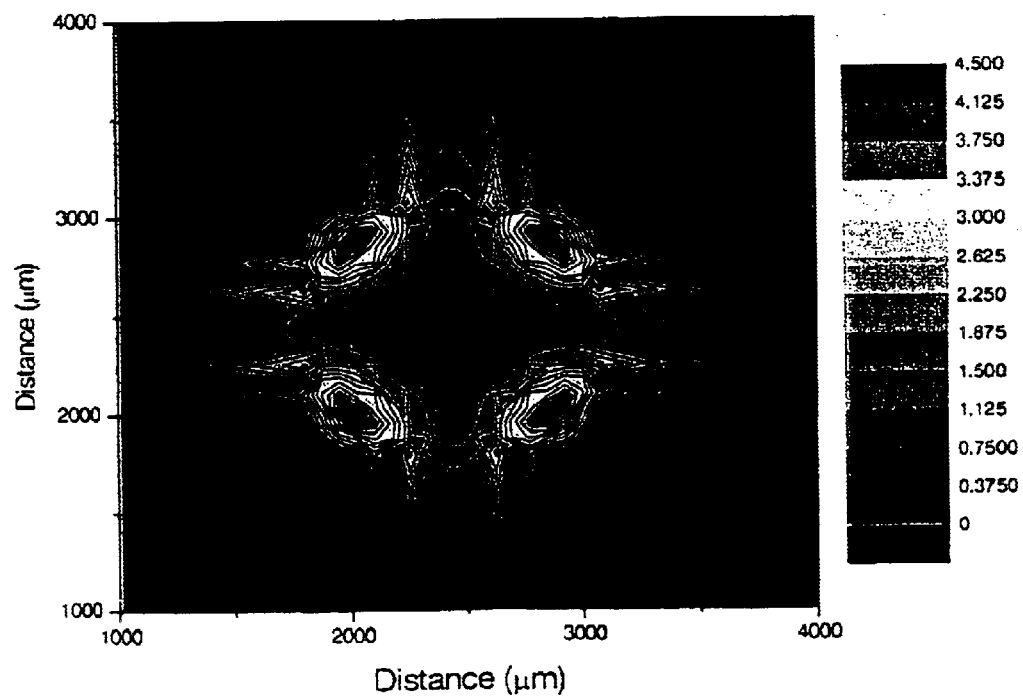
FIG. 9b shows the near-field profile for a typical out-of-phase mode of TM-polarized square-lattice SE PCDFBs.

FIGS. 9(a)–9(b) show near-field patterns for typical in-phase and out-of-phase modes, respectively. For the out-of-phase mode in FIG. 9(b) the four field components lead to four lobes in the near field. Condition (3), which requires $\kappa_1$<0 and $\kappa_2$<0, leads to an additional constraint that the square lattice cannot also have square etch features. One can show using Eqs. (4) and (5) that symmetry would then lead to at least one coupling coefficient ($\kappa_1$ for $P_1$ oriented along the diagonal of the primitive unit cell) that is identically non-negative because it is proportional to the product of two sines having the same argument. However, if circular features with diameter d$\approx$0.70$\Lambda$ are used, all five Conditions can be met in the lowest diffraction order that permits surface emission (m=2 in the square-lattice notation as above). This contrasts the hexagonal-lattice case, in that there it was necessary to go to the second-lowest permissible diffraction order to obtain optimal results. The simulations yield that in-phase operation may be expected for any circle diameter in the range 0.68Λ<d<0.80Λ, and for etch depths as much as 50% less than the optimal value. These ranges are rather non-restrictive from the fabrication standpoint.

FIG. 10 illustrates the normalized brightness that can be obtained using d=0.70Λ and Δn=0.043, for which: $\kappa_1$=−17 cm$^{-1}$, $\kappa_2$=−21 cm$^{-1}$, and $\kappa_0$=0.74 cm$^{-1}$. The simulations employed $d_g/\Gamma_g$=4 µm, an appropriate value for a QCL designed for emission at $\lambda_c$=4.6 µm. For example, the normalized brightness that can be achieved is seen to be quite similar to the results shown in FIG. 4 for TE polarization and a hexagonal lattice. While in-phase operation with LEF=0.05 can be obtained when α≧15 cm$^{-1}$, for LEF=1.5 it is realized when α<25 cm$^{-1}$. Best results are obtained over the full range of internal-loss values for LEF=0.5, which can in principle be achieved in well-designed QW devices, although in low-loss materials LEF= 1.5 is slightly preferable. Again, active regions with LEF>2 will display lower normalized brightness.

Figure 11:
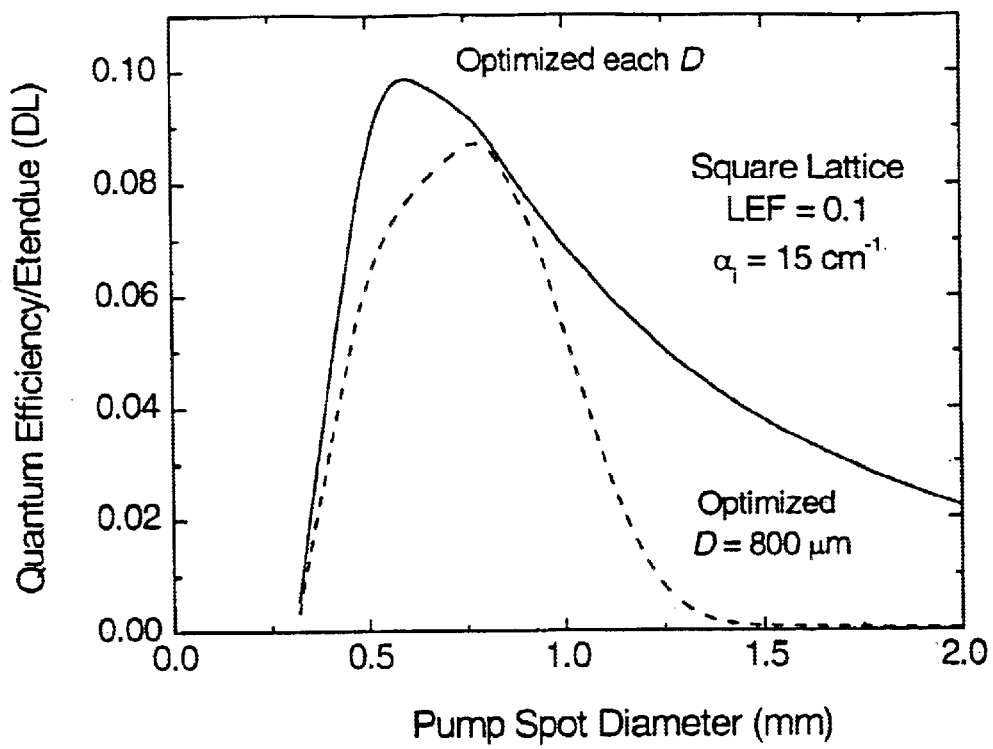
FIG. 11 is a graph showing normalized brightness as a function of pump-spot diameter D for square-lattice TM-polarized SE PCDFBs with circular features of diameter $d=0.70\Lambda$, LEF=0.1, and $\alpha=15$ cm$^{-1}$. The solid curve represents re-optimization of the index modulation for each value of the pump-spot diameter, whereas the dashed curve holds $\Delta n$ fixed at 0.043 (optimized for D=800 $\mu$m).

Since most intersubband lasers have LEF<0.1, it may be difficult to design QCL SE PCDFBs that simultaneously optimize both the efficiency and the mode quality. One possibility is to use band structure engineering to alter the densities of states near the lasing transition energy, such that the LEF is increased. For a QCL with LEF=0.1, FIG. 11 plots the normalized brightness as a function of pump-spot diameter. The solid curve employs the optimized etch depth at each D (Δn ranging from 0.056 at D=300 µm to 0.021 at D=2 mm), while the dashed curve assumes a fixed etch depth optimized for D=800 µm (Δn=0.043). The smallest pump spot for which in-phase operation can be expected is D≈400 µm, which places high demands on the requirements for current spreading in electrically pumped devices. However, the large transport anisotropy in a QCL (the mobility is much higher in the plane than along the current-injection axis) is beneficial in this regard. The degradation of the normalized brightness at large pump spots is also much faster for the square lattice than for the hexagonal lattice.

Figure 12:
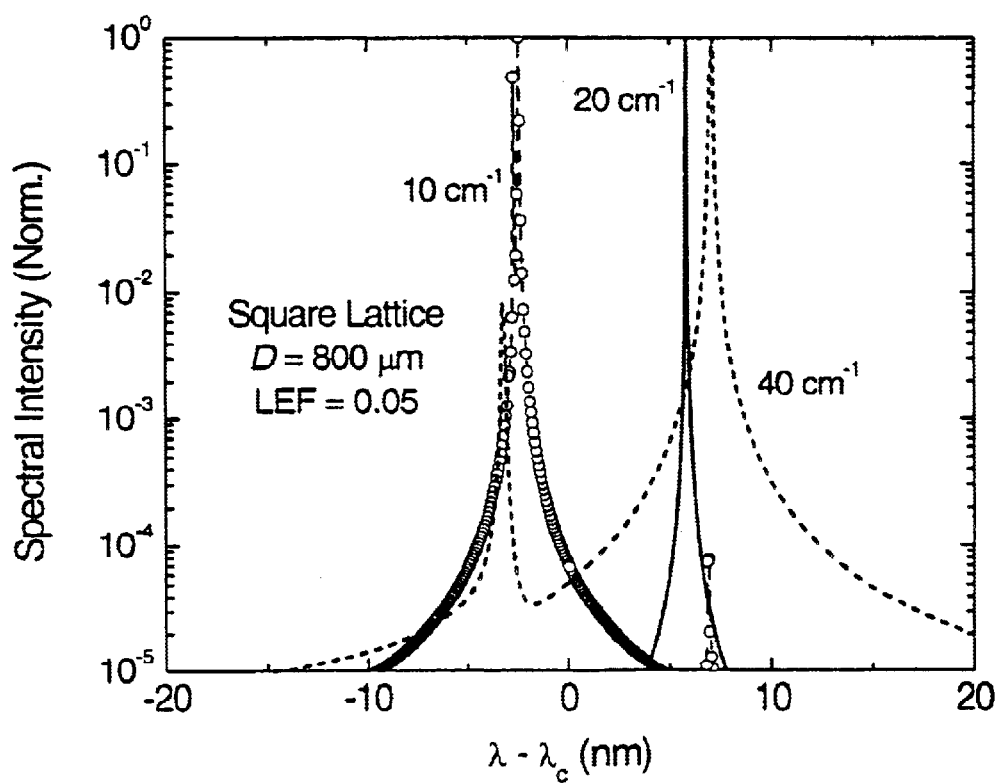
FIG. 12 is a graph showing spectral characteristics of square-lattice TM-polarized SE PCDFBs with D=800 $\mu$m, $\Delta n=0.043$, and LEF=0.05, for internal losses of 10 cm$^{-1}$ (dashed curve with points), 20 cm$^{-1}$ (solid), and 40 cm$^{-1}$ (dotted). The peak intensities are normalized to unity.

FIG. 12 shows typical spectral characteristics for TM-polarized SE PCDFB lasers employing the square-lattice geometry, where LEF=0.05 and spectra are given for several values of the internal loss. The inventors have found that while single-mode operation with a large SMSR is possible for α=20 cm$^{-1}$, the SMSR drops to 21 dB when α=40 cm$^{-1}$, and the device is essentially multi-mode with broadening of the main lasing line for α=10 cm$^{-1}$.

The SE 1D DFB lasers may also benefit from the SPSF technique, as disclosed in embodiments of the present invention, for achieving lasing in the in-phase mode, which has never been pointed out previously. The conditions (Conditions (1)–(5)) that apply to SE 1D DFB lasers are quite similar to those specified above that are required for SE PCDFB lasers. Condition (3) is modified to include only $\kappa_1$, and Condition (4) is modified to refer to the pumped length rather than beam diameter.

Figure 13:
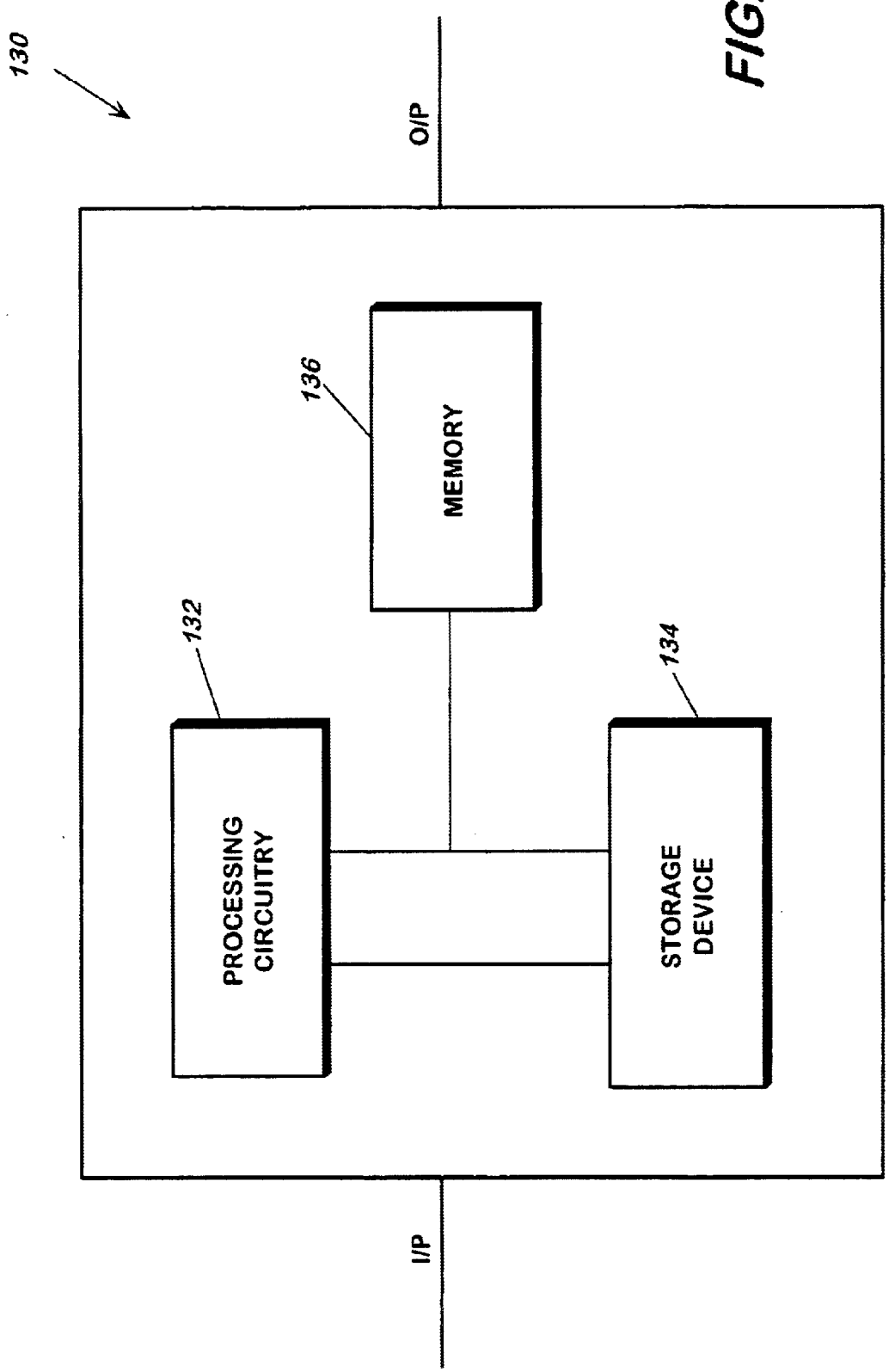
FIG. 13 is a high level block diagram of a computer system for implementing the methodology of the present invention in one embodiment.

FIG. 13 is a high-level block diagram of a computer system 130 for implementing the methodology of the present invention in one embodiment. The computer system 130 includes processing circuitry 132, storage device 134, and memory 136. The processing circuitry 132 may be arranged to execute programming instructions (e.g., software, hardware, etc.) to process input data to produce a near-diffraction-limited beam using SE PCDFB. Accordingly, in such arrangement, processing circuitry 132 may be implemented as a microprocessor of a notebook computer, personal computer; workstation or other digital signal processing arrangement. Processing circuitry 132 may also comprise a field programmable gate array or any other hardware and/or software configuration capable of producing desired output data as described above.

Memory 136 and processing circuitry 132 are depicted separate from one another. In other possible embodiments, memory 136 and processing circuitry 132 may be embodied within a single device. Memory 136 may be arranged to store digital information and instructions and may be embodied as random access memory (RAM), read only memory (ROM), flash memory or another configuration capable of storing digital information, instructions (e.g., software or firmware instructions utilized by the processing circuitry 132), or other digital data desired to be stored within storage device 134.

Figure 14:
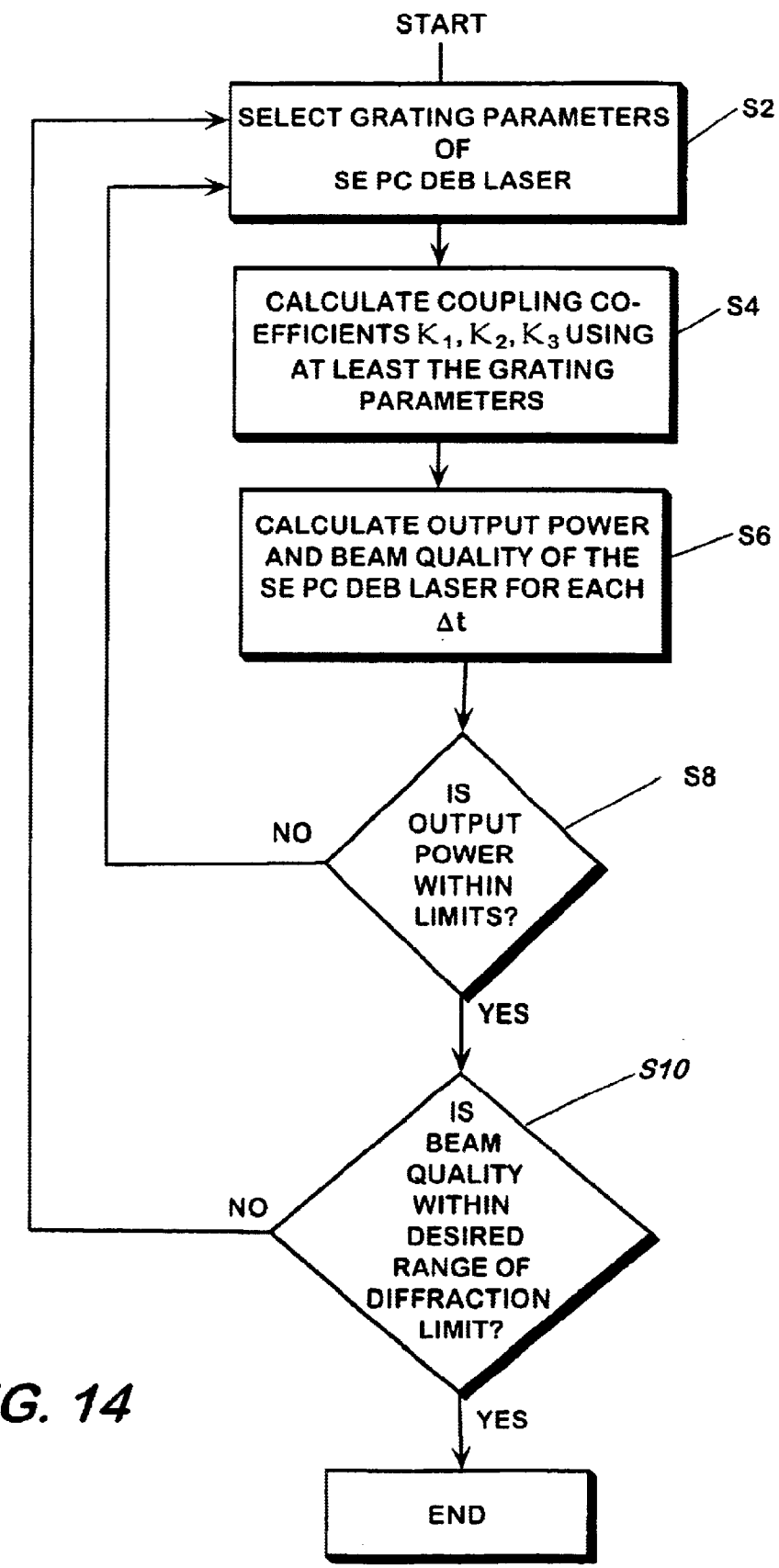
FIG. 14 is a methodology for producing a near-diffraction-limited beam using a surface emission photonic crystal DFB laser in one embodiment.

FIG. 14 is a methodology for producing a near-diffraction-limited beam using a surface emission photonic crystal DFB laser in one embodiment. At a step S2, the processing circuitry 132 (FIG. 13) is configured to select grating parameters of the 2D grating 110 (FIG. 1a), the grating parameters including for example, grating order, circular feature diameter, and index modulation achieved by etching the grating to a desired depth.

At a step S4, coupling coefficients $\kappa_1$, $\kappa_2$, $\kappa_3$ are calculated using the grating parameters.

At a step S6, output power and beam quality of the SE PCDFB laser are calculated for a sufficiently large number of time intervals Δt.

At a step S8, an inquiry is made to determine if the output power is within predetermined limits. If yes, the method proceeds to step S10. If no, the method proceeds to step S2 where one or more grating parameters are varied and the method is iterated.

At a step S10, an inquiry is made to determine if the beam quality is within a desired range of diffraction limit. If no, the method proceeds to step S2.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A surface-emitting photonic crystal distributed feedback laser apparatus configured to emit an optical beam of light, comprising:
   a laser waveguide bounded by a top and bottom optical claddings;
   an active region configured to produce optical gain upon receiving optical or electrical pumping;
   a periodic two-dimensional grating having an order higher than the fundamental, the grating configured to induce modulation of a modal refractive index; and
   a lateral pumped gain area contained within an area covered by the grating, the lateral pumped gain area configured to produce gain in one or more lasing modes having a modal index modulated by the grating, the lateral pumped gain area having a substantially circular shape of diameter D, and wherein the gain area is enclosed by an unpumped region contained within the area covered by the grating but not receiving the optical or electrical pumping.

2. The apparatus of claim 1, further comprising:
   a reflector disposed at an opposite vertical end with respect to an output beam emitted by the laser apparatus such that reflection of light from the reflector constructively interferes with the output beam.

3. The apparatus of claim 2, wherein the reflector is used to enhance output power of the optical beam by up to a factor of 2, and wherein emission is primarily into an in-phase symmetrical mode with a substantially circular lateral profile.

4. The apparatus of claim 1, wherein the wavelength spectrum of the optical beam is substantially single-mode.

5. The apparatus of claim 1, wherein the laser is configured to maximize the output power of the optical beam so that a differential quantum efficiency is not less than about 3%.

6. The apparatus of claim 1, wherein the laser is configured to optimize beam quality of the optical beam so that the beam quality is not worse than about three times the diffraction limit.

7. The apparatus of 1, further comprising:
an electrode that is optically transparent in the wavelength spectrum of emission.

8. The apparatus of claim 1, wherein the linewidth enhancement factor of the laser is between 1 and 2 with modal loss minimized.

9. The apparatus of claim 8, wherein the product of a linewidth enhancement factor and modal loss is no smaller than about 1–2 cm$^{-1}$, the linewidth enhancement factor not exceeding about 3.

10. The apparatus of claim 8, wherein the linewidth enhancement factor is increased to about 1 by varying electronic densities of states.

11. The apparatus of claim 1, wherein the grating is defined on a hexagonal lattice with six equivalent propagation directions spaced at 60° angles, and the grating is configured to produce three in-plane diffraction processes from one of said equivalent propagation directions into another one of the equivalent propagation directions, the first of said diffraction processes being reflection by an angle of 180° and having a coupling coefficient $\kappa_1$, the second of said diffraction processes being diffraction by an angle of 60° and having a coupling coefficient of $\kappa_2$, and the third of said diffraction processes being diffraction by an angle of 60° and having a coupling coefficient of $\kappa_3$, and an out-of-plane diffraction process from one of said equivalent propagation directions into a direction perpendicular to all six of said directions and having a coupling coefficient $\kappa_0$.

12. The apparatus of claim 11, wherein the coupling coefficient $\kappa_0$ is no larger than about 1 cm$^{-1}$.

13. The apparatus of claim 11, wherein magnitude of at least two in-plane coupling coefficients range from 1/D to 3/D, while the magnitude of the third in-plane coefficient is between 1/5D and 3/D.

14. The apparatus of claim 11, wherein the optical beam is TE-polarized, and the in-plane coupling coefficients have the following signs: $\kappa_1<0$, $\kappa_2<0$, and $\kappa_3<0$.

15. The apparatus of claim 11, wherein the diffraction is at the Γ point of the hexagonal lattice, and the order of diffraction is a m=2 multiple of the lowest order that produces emission perpendicular to said equivalent propagation directions.

16. The apparatus of claim 11, wherein etch features of the grating are substantially circular with a diameter of about 60–70% of the period of the hexagonal lattice.

17. The apparatus of claim 11, wherein the optical beam is TE-polarized and the in-plane coupling coefficients have the following signs: $\kappa_1 \gtrless 0$, $\kappa_2>0$, and $\kappa_3<0$.

18. The apparatus of claim 11, wherein the optical beam is TM-polarized, and the in-plane coupling coefficients have the following signs: $\kappa_1<0$, $\kappa_2<0$, and $\kappa_3<0$.

19. The apparatus of claim 1, wherein the grating is defined on a square lattice with four equivalent propagation directions spaced at 90° angles, and the grating is configured to produce three distinct in-plane diffraction processes from one of said equivalent propagation directions into another one of the equivalent propagation directions, the first of said diffraction processes being reflection by an angle of 180° and having a coupling coefficient $\kappa_1$, and the second and third of said diffraction processes being diffraction by an angle of 90° and having a coupling coefficient of $\kappa_2$, and an out-of-plane diffraction process from one of said equivalent propagation directions into a direction perpendicular to all four of said directions and having a coupling coefficient $\kappa_0$.

20. The apparatus of claim 19, wherein the coupling coefficient $\kappa_0$ is no larger than about 1 cm$^{-1}$.

21. The apparatus of claim 19, wherein magnitude of the two distinct coupling coefficients $\kappa_1$ and $\kappa_2$ is between 1/D and 3/D.

22. The apparatus of claim 19, wherein the optical beam is TM-polarized and the in-plane coupling coefficients have the following signs: $\kappa_1<0$ and $\kappa_2<0$.

23. A method of producing a near-diffraction-limited optical beam of light using a surface emission photonic crystal distributed feedback laser, comprising:
providing a laser waveguide bounded by a top and bottom optical claddings;
configuring an active region of the waveguide to produce optical gain upon receiving optical or electrical pumping;
providing a periodic two-dimensional grating having an order higher than a fundamental to induce modulation of a modal refractive index;
confining a lateral pumped gain area to within area covered by the grating, the lateral pumped gain area configured to produce gain in at least one lasing mode having a modal index modulated by the grating, the lateral pumped gain area having a substantially circular shape of diameter D; and
enclosing the lateral pumped gain area by an unpumped region contained within the area covered by the grating but not receiving the optical or electrical pumping.

24. The method of claim 23, further comprising:
providing a reflector disposed at an opposite vertical end with respect to an output beam emitted from the laser such that light reflected from the reflector constructively interferes with the output beam.

25. The method of claim 24, wherein the reflector is used to enhance the output power of the optical beam by up to a factor of 2, and wherein emission is primarily into an in-phase symmetrical mode with a substantially circular lateral profile.

26. The method of claim 23, wherein the wavelength spectrum of the optical beam is substantially single-mode.

27. The method of claim 23, wherein the laser is configured to maximize the output power of the optical beam so that a differential quantum efficiency is not less than about 3%, and optimize beam quality of the optical beam so that the beam quality is not worse than about three times the diffraction limit.

28. The method of claim 23, wherein the linewidth enhancement factor of the laser is between 1 and 2 with modal loss minimized.

29. The method of claim 28, wherein the product of the linewidth enhancement factor and modal loss is no smaller than about 1–2 cm$^{-1}$, the linewidth enhancement factor not exceeding about 3.

30. The method of claim 28, wherein the linewidth enhancement factor is increased to about 1 by varying electronic densities of states.

31. The method of claim 23, further comprising:
defining the grating on a hexagonal lattice with six equivalent propagation directions spaced at 60° angles, and the grating is configured to produce three in-plane diffraction processes from one of said equivalent propagation directions into another one of the equivalent propagation directions, the first of said diffraction processes being reflection by an angle of 180° and having a coupling coefficient $\kappa_1$, the second of said diffraction processes being diffraction by an angle of 60° and having a coupling coefficient of $\kappa_2$, and the third of said diffraction processes being diffraction by an angle of 60° and having a coupling coefficient of $\kappa_3$, and an out-of-plane diffraction process from one of said equivalent propagation directions into a direction perpendicular to all six of said directions and having a coupling coefficient $\kappa_0$.

32. The method of claim 31, wherein the coupling coefficient $\kappa_0$ is no larger than about 1 cm$^{-1}$, and the magnitude of at least two in-plane-coupling coefficients ranges from 1/D to 3/D, while the magnitude of the third in-plane coefficient is between 1/5D and 3/D.

33. The method of claim 31, wherein the optical beam is TE-polarized, and the in-plane coupling coefficients have the following signs: $\kappa_1<0$, $\kappa_2<0$, and $\kappa_3<0$, and wherein the diffraction is at the $\Gamma$ point of the hexagonal lattice, and the order of diffraction is a m=2 multiple of the lowest order that produces emission perpendicular to said equivalent propagation directions.

34. The method of claim 31, wherein etch features of the grating are substantially circular with a diameter of about 60–70% of the period of the hexagonal lattice.

35. The method of claim 31, wherein the optical beam is TE-polarized and the in-plane coupling coefficients have the following signs: $\kappa_1<0$, $\kappa_2>0$, and $\kappa_3<0$.

36. The method of claim 31, wherein the optical beam is TM-polarized, and the in-plane coupling coefficients have the following signs: $\kappa_1<0$, $\kappa_2<0$, and $\kappa_3<0$.

37. The method of claim 23, wherein the grating is defined on a square lattice with four equivalent propagation directions spaced at 90° angles, and the grating is configured to produce three distinct in-plane diffraction processes from one of said equivalent propagation directions into another one of the equivalent propagation directions, the first of said diffraction processes being reflection by an angle of 180° and having a coupling coefficient $\kappa_1$, and the second and third of said diffraction processes being diffraction by an angle of 90° and having a coupling coefficient of $\kappa_2$, and an out-of-plane diffraction process from one of said equivalent propagation directions into a direction perpendicular to all four of said directions and having a coupling coefficient $\kappa_0$.

38. The method of claim 37, wherein magnitude of the two distinct coupling coefficients $\kappa_1$ and $\kappa_2$ is between 1/D and 3/D, the optical beam is TM-polarized, and the in-plane coupling coefficients have the following signs: $\kappa_1<0$ and $\kappa_2<0$.

39. method of producing a near-diffraction-limited beam of light using a surface emission photonic crystal distributed feedback laser, comprising:
a) selecting one or more parameters for a two-dimensional grating to operate at a predetermined wavelength;
b) calculating coupling coefficients $\kappa_1$, $\kappa_2$, and $\kappa_3$ using at least the grating parameters;
c) calculating output power and beam quality of the laser, the calculating comprising:
for each time interval $\Delta t$, calculating:
i) for each mesh point with coordinates $(I_x, I_z)$ in a laser plane representing rectangular region with dimensions $\Delta x$, $\Delta z$, calculating modal gain and carrier-induced index change using rate equations for carrier density and numerically integrating gain and index parts of the rate equations;
ii) performing a two-dimensional Discrete Fourier Transform in the laser plane with respect to x and z;
iii) for each mesh point with coordinates $(I_x I_z)$ in a laser plane representing rectangular region with dimensions $\Delta x$, $\Delta z$, numerically integrate $$\frac{\partial \tilde{a}_1}{\partial t} = \frac{c}{n_0}\left[-i\frac{2\pi l_z}{L_z \Delta z}\tilde{a}_1 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_1 + (-i\kappa_1 - \kappa_0)\tilde{a}_1 + (-i\kappa_2 - \kappa_0)(\tilde{a}_2 + \tilde{\bar{a}}_2)\right] \text{ and}$$

$$\frac{\partial \tilde{a}_2}{\partial t} = \frac{c}{n_0}\left[-i\frac{2\pi l_x}{L_x \Delta x}\tilde{a}_2 - \frac{i}{2k_0 n_0}\left(\frac{4\pi^2 l_x^2}{L_x^2(\Delta x)^2} + \frac{4\pi^2 l_z^2}{L_z^2(\Delta z)^2}\right)\tilde{a}_2 + (-i\kappa_1 - \kappa_0)\tilde{a}_2 + (-i\kappa_2 - \kappa_0)(\tilde{a}_1 + \tilde{\bar{a}}_1)\right];$$

and
iv) performing a two-dimensional inverse discrete Fourier transform in the laser plane with respect to x and z;
determining if the output power corresponds to desired quantum efficiency; and
e) determining if the beam quality is in a desired range of diffraction limit.

40. The method of claim 39, further comprising:
f) varying the one more parameters and iterating steps b)–e) it the output power and beam quality do not converge to determined values.

41. The method claim 39, wherein the one or more parameters of the grating comprise grating order m, circular-feature diameter d, and index modulation $\Delta n$ achieved by etching the grating to a predetermined depth.

* * * * *